United States Patent
Whetsel

(10) Patent No.: US 10,197,626 B2
(45) Date of Patent: Feb. 5, 2019

(54) TAP DUAL PORT ROUTER WITH UPDATE LEAD AND GATED UPDATEDR

(71) Applicant: TEXAS INSTRUMENTS INCORPORATED, Dallas, TX (US)

(72) Inventor: Lee D. Whetsel, Parker, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 15/652,911

(22) Filed: Jul. 18, 2017

(65) Prior Publication Data

US 2017/0315171 A1 Nov. 2, 2017

Related U.S. Application Data

(62) Division of application No. 15/340,507, filed on Nov. 1, 2016, now Pat. No. 9,753,085, which is a division of application No. 14/978,752, filed on Dec. 22, 2015, now Pat. No. 9,513,336, which is a division of application No. 14/547,830, filed on Nov. 19, 2014, now Pat. No. 9,261,559, which is a division of application No. 13/587,522, filed on Aug. 16, 2012, now Pat. No. 8,924,802.

(60) Provisional application No. 61/524,632, filed on Aug. 17, 2011.

(51) Int. Cl.
  *G01R 31/3177* (2006.01)
  *G01R 31/3185* (2006.01)
  *G01R 31/317* (2006.01)

(52) U.S. Cl.
  CPC ... *G01R 31/3177* (2013.01); *G01R 31/31723* (2013.01); *G01R 31/31724* (2013.01); *G01R 31/31725* (2013.01); *G01R 31/318508* (2013.01); *G01R 31/318513* (2013.01); *G01R 31/318555* (2013.01); *G01R 31/318597* (2013.01)

(58) Field of Classification Search
  CPC .......... G01R 31/3177; G01R 31/31725; G01R 31/31723; G01R 31/31724; G01R 31/318597; G01R 31/318508; G01R 31/318513; G01R 31/318555
  See application file for complete search history.

(56) References Cited

U.S. PATENT DOCUMENTS

| 5,526,365 | A | 6/1996 | Whetsel |
| 6,151,689 | A | 11/2000 | Garcia et al. |
| 6,430,718 | B1 * | 8/2002 | Nayak ............ G01R 31/31853 714/727 |
| 6,744,274 | B1 | 6/2004 | Arnold et al. |
| 7,958,387 | B2 | 6/2011 | Silverman et al. |
| 8,694,844 | B2 | 4/2014 | Whetsel |

(Continued)

OTHER PUBLICATIONS

IEEE Standard Test Access Port and Boundary Scan Architecture, in IEEE Std 1149.1-2001, vol., No., pp. 1-212, Jul. 23, 2001.*

(Continued)

*Primary Examiner* — Cynthia Britt
(74) *Attorney, Agent, or Firm* — Lawrence J. Bassuk; Charles A. Brill; Frank D. Cimino

(57) ABSTRACT

This disclosure describes a test architecture that supports a common approach to testing individual die and dies in a 3D stack arrangement. The test architecture uses an improved TAP design to facilitate the testing of parallel test circuits within the die.

4 Claims, 18 Drawing Sheets

(56) References Cited

U.S. PATENT DOCUMENTS

| | | | |
|---|---|---|---|
| 2003/0212524 A1* | 11/2003 | Cote | G01R 31/31724 702/120 |
| 2010/0223515 A1* | 9/2010 | Nieuwland | G01R 31/31719 714/726 |
| 2011/0225456 A1 | 9/2011 | Whetsel | |
| 2012/0102375 A1 | 4/2012 | Whetsel | |

OTHER PUBLICATIONS

Chunsheng Liu; Link, Z.; Pardhan, D.K., "Reuse-based test access and integrated test scheduling for network-on-chip," Design, Automation and Test in Europe, 2006, DATE '06. Proceedings, vol. 1, No., pp. 6, pp., Mar. 6-10, 2006.

Munyoung Lee; Kideok Cho; Kunwoo Park; Kwon, T.; Yanghee Choi, "Scan: Scalable Content Routing for Content-Aware Networking," Communications (ICC), 2011 IEEE International Conference on, vol., No., pp. 1, 5, Jun. 5-9, 2011.

Amory, AM.; Briao, E.; Cota, E.; Lubaszewski, M.; Moraes, F.G., "A scalable test strategy for network-on-chip routers," Test Conference 2005. Proceedings. ITC 2005. IEEE International, vo., No., pp. 9 pp. 599 8-8 Nov. 2005.

* cited by examiner

TAP DUAL PORT ROUTER WITH UPDATE LEAD AND GATED UPDATEDR

REFERENCE TO RELATED DISCLOSURES

This Application is a Divisional of prior application Ser. No. 15/340,507, filed Nov. 1, 2016, now U.S. Pat. No. 9,753,085, issued Sep. 17, 2017;

Which was a divisional of prior application Ser. No. 14/978,752, filed Dec. 22, 2015, now U.S. Pat. No. 9,513,336, issued Dec. 6, 2016;

Which was a divisional of prior application Ser. No. 14/547,830, filed Nov. 19, 2014, now U.S. Pat. No. 9,261,559, issued Apr. 16, 2016;

Which was a divisional of prior application Ser. No. 13/587,522, filed Aug. 16, 2012, now U.S. Pat. No. 8,924,802, issued Dec. 30, 2014;

And claims priority from Provisional Application No. 61/524,632, filed Aug. 17, 2011.

This disclosure is related to pending application Ser. No. 13/188,078 and U.S. Pat. Nos. 7,404,129 and 7,346,821.

FIELD OF THE DISCLOSURE

This disclosure relates generally to three dimensional (3D) stacked die and specifically to a test architecture that supports the testing of die in the 3D stack.

BACKGROUND OF THE DISCLOSURE

Integrated circuit die may be designed such that they may be stacked on top of one another to form a stacked die arrangement for mounting on a system substrate, such as, but not limited to, a printed circuit board. Prior to assembling a stacked die, each die to be stacked must be tested to ensure goodness. After a stacked die is assembled, it must be tested again to ensure the goodness of the assembly.

Testing of the individual die is typically done by a die tester. Testing of the stacked die assembly is typically done by a stacked die assembly tester. The test architecture designed into the die must be capable of supporting both the testing of the individual die on the die tester and the testing of the final stacked die assembly on the stacked die tester. The present disclosure describes a test architecture that supports both individual die testing and final stacked die assembly testing.

BRIEF SUMMARY OF THE DISCLOSURE

This disclosure describes a test architecture that supports the testing of individual die and 3D stacked die arrangements.

BRIEF DESCRIPTIONS OF THE VIEWS OF THE DRAWINGS

FIG. 1 illustrates an IEEE Test Access Port (TAP).
FIG. 2 illustrates the state diagram of the TAP.
FIG. 3 illustrates a TAP capture and shift operation.
FIG. 4 illustrates a TAP capture, shift and update operation.
FIG. 5 illustrates an improved TAP design of the disclosure.
FIG. 6 illustrate a dual port router (DPR) of the disclosure.
FIG. 7 illustrate an improved TAP capture and shift operation.
FIG. 8 illustrate a DPR of the disclosure.
FIG. 9 illustrate an improved TAP capture, shift and update operation.
FIG. 10 illustrates a test architecture of the disclosure.
FIG. 11 illustrate stacked die using bond wires.
FIG. 12 illustrates stacked die using through silicon vias (TSVs).
FIG. 13A illustrates a test architecture of the disclosure.
FIGS. 13B-13E illustrates various test control signal gating circuits of the disclosure.
FIG. 14 illustrates a test architecture of the disclosure.
FIG. 15 illustrates a die stack according to the disclosure.
FIG. 16 illustrates a die stack according to the disclosure.
FIG. 17 illustrates a test architecture of the disclosure.
FIG. 18 illustrates test circuit of the disclosure.
FIG. 19 illustrates a compare circuit of the disclosure.
FIG. 20 illustrates a maskable compare circuit of the disclosure.
FIG. 21 illustrates a test architecture of the disclosure.
FIG. 22 illustrates a die stack according to the disclosure.
FIG. 23 illustrates a test architecture of the disclosure.
FIG. 24 illustrates a test architecture of the disclosure.
FIG. 25 illustrates a test architecture of the disclosure.
FIG. 26 illustrates a multiple TAP Domain architecture of the disclosure.
FIG. 27 illustrates a die stack according to the disclosure.

DETAILED DESCRIPTION OF THE DISCLOSURE

FIG. 1 illustrates a die 100 including a conventional IEEE 1149.1 test architecture. The architecture includes a TAP State Machine (TSM), an instruction register 104, data registers 1-N 106 including a bypass register and boundary register, TDO multiplexer circuitry 108 and a router for navigating control signals from the TSM to a target data register. The die has inputs for a TDI, TCK and TMS signal and an output for a TDO signal. The TSM inputs the TCK and TMS signals, and outputs data register control (DRC) to the router, instruction register control (IRC) to the instruction register and a Select signal to the TDO multiplexer circuitry. The instruction register inputs the TDI signal and the IRC signals and outputs control on an instruction register output (IRO) bus and a TDO signal to the TDO output via the TDO multiplexer. Each data register inputs the TDI signal, DRC inputs from the router and outputs a TDO signal to the TDO output via the TDO multiplexer. During instruction scan operations, the TSM controls the instruction register to capture instruction data, shift instruction data from TDI to TDO and update the instruction data from the instruction register. During data scan operations the TSM controls a data register selected by the current instruction to capture data, shift data from TDI to TDO and update data from the data register.

FIG. 3 illustrates a first example router circuit 110 that can be enabled by the IRO bus to control capture and shift operations to a data register 106. In this example, the router circuit couples ClockDR and ShiftDR signals 302 from the DRC output bus of TSM 102 to ClockDR and ShiftDR signals 304 to the DRC input bus of the data register, via gating circuits 308 and 310. The ClockDR provides the clock input to the data register and the ShiftDR signal provides the capture or shift input to the data register. The repeating TSM state transitions 306 to access the data register is indicated in FIG. 3. As shown there are dead states (dotted line box states) in the repeating TSM state transitions. For example, there are 3 dead states between the last ShiftDR operation and the CaptureDR operation. This prevents the TSM from being able to perform at speed shift and capture operations. This is a well known TSM testing limitation.

FIG. 4 illustrates a second example router circuit 110 that can be enabled by the IRO bus to control capture, shift and update operations to a data register 106. In this example, the router circuit couples ClockDR, ShiftDR and UpdateDR signals 402 from the DRC output bus of TSM 102 to ClockDR, ShiftDR and UpdateDR signals 404 to the DRC input bus of the data register, via gating circuits 408-412. The ClockDR provides the clock input to the data register, the ShiftDR signal provides the capture or shift input to the data register and the UpdateDR signal provides the update input to the data register. The repeating TSM state transitions 406 to access the data register is indicated in FIG. 4. As shown there are dead states (dotted line box states) in the repeating TSM state transitions. For example, there is a dead state between the last ShiftDR operation and the UpdateDR operation and another dead state between the UpdateDR operation and the CaptureDR operation. Thus at speed shift and update operations and at speed update and capture operations cannot be performed using TSM state transitions. This is a well known TSM testing limitation.

The following disclosure provides a die test architecture that includes an improved TAP in combination with a parallel test input and output mechanism for facilitating the testing of functional circuits within the die.

FIG. 5 illustrates a die 500 including the improved TAP architecture of the disclosure. The TAP architecture is identical to the TAP architecture of FIG. 1 with the exception that the router 102 of FIG. 1 has been replaced with a dual port router (DPR) 502. The TAP architecture of FIG. 5 also includes two new inputs, a Capture (CPT) input and an Update (UPD) input. The first input port 504 of the DPR is coupled to the DRC outputs from the TSM and the second input port 506 of the DPR is coupled to the CPT and UPD inputs. The DRC outputs of the DPR are coupled to respective data registers 106. The DPR inputs IRO signals from the instruction register. During instruction scan operations, the TSM controls the instruction register to capture instruction data, shift instruction data from TDI to TDO and update the instruction data from the instruction register.

During data scan operations when the IRO bus selects the first input port 504 of the DPR, the TSM controls a data register selected by the current instruction to capture data, shift data from TDI to TDO and update data from the data register. When the first port of the DPR is selected, the TAP architecture of FIG. 5 operates exactly like the TAP architecture of FIG. 1. However, during data scan operations when the IRO bus selects the second input port of the DPR, the TSM controls the shifting of a selected data register between TDI and TDO, but the capture and update operations of the data register are controlled by the CPT and UPD inputs, respectively.

FIG. 6 illustrates a first example DPR circuit 502 that can be enabled by the IRO bus to control capture and shift operations to a data register 106. As seen, the example DPR circuit is identical to the example router circuit of FIG. 3 with the exception that a multiplexer has been placed on ShiftDR input of gate 308. When the ShiftDR output signal of bus 304 is to be controlled by the ShiftDR input signal of bus 302, the IRO input will enable the gates and will set the multiplexer to input the ShiftDR signal from the TSM to gate 308. When the ShiftDR output signal of bus 304 is to be controlled by the CPT input signal, the IRO input will enable the gates and will set the multiplexer to input the CPT signal to gate 308.

FIG. 7 illustrates the timing diagram of performing capture and shift operations using the CPT input. As seen the TSM will go to and remain in the ShiftDR state (TMS=0) to cause data to shift through the data register from TDI to TDO. At appropriate times during the shifting the CPT signal will be asserted, to cause a capture operation to occur, then de-asserted to resume shifting. As seen, there are no dead states in the capture and shift operations when using the CPT signal, as there were in the FIG. 3 timing example 306.

FIG. 8 illustrates a first example DPR circuit 502 that can be enabled by the IRO bus to control capture, shift and update operations to a data register 106. As seen, the example DPR circuit is identical to the example router circuit of FIG. 4 with the exception that a multiplexer 804 has been placed on ShiftDR input of gate 410 and a multiplexer 802 has been place on the UpdateDR input of gate 408. When the ShiftDR and UpdateDR output signals of bus 404 are to be controlled by the ShiftDR and UpdateDR inputs of bus 402, the IRO input will enable gates 408-412 and will set the multiplexers to input the ShiftDR and UpdateDR signals from the TSM to gates 408 and 410. When the ShiftDR and UpdateDR output signals of bus 404 are to be controlled by the CPT and UPD input signals, the IRO input will enable the gates and will set the multiplexers to input the CPT and UPD input signals gates 410 and 408.

FIG. 9 illustrates the timing diagram of performing capture, shift and update operations using the CPT and UPD inputs. As seen the TSM will go to and remain in the ShiftDR state to cause data to shift through the data register from TDI to TDO. During the shifting the UPD signal will be asserted to cause an update operation to occur, then the CPT signal will be asserted to cause a capture operation to occur. Shifting resumes following the update and capture operations. As seen, there are no dead states in the capture, shift and update operations when using the CPT and UPD signals, as there were in the FIG. 4 timing example 306.

FIG. 10 illustrates a die 1000 containing the improved TAP architecture 1002 of FIG. 5 coupled to parallel test circuits 1-N 1004 via the DRC and IRO buses of the improved TAP architecture. As seen in FIG. 10, the DRC and IRO buses of FIG. 5 are extended from the improved TAP architecture 1002 to form connections to the parallel test circuits 1004. Each parallel test circuit has a group of Parallel Test Data Inputs (PTDI) and a group of Parallel Test Data Outputs (PTDO). When enabled by the IRO bus, a parallel test circuit may be operated by the DRC signals from the DPR to perform capture and shift operations, or capture, shift and update operations. The IRO inputs to the DPR allow the capture and shift or capture, shift and update operations to be selectively controlled by the TSM, as shown in FIGS. 3 and 4, or by the CPT and UPD signals, as shown in FIGS. 6-9. The advantage of using the CPT and UPD signals to control a parallel test circuit is that the capture and shift and the capture, shift and update operations do not include dead states. During the shifting part of the above mentioned operations, the parallel test circuit inputs parallel test data from PTDI and outputs parallel test data to PTDO. During test, the PTDI and PTDO buses are coupled to external leads of die 1000, as will be shown and described in regard to FIGS. 13, 14, 16, 17, 21, 22, 23, and 24.

FIG. 11 illustrates an older approach 1100 of stacking die on top of one another. This example shows the stack including a bottom die, a middle die and a top die. This stacking approach is based on a pyramid arrangement where smaller die are stacked onto larger lower. The die are connected to each other using bond wires 1102 located between bond pads 1104 at the periphery of the die. While not shown each die contains functional circuits that are connected to the bond pads. The bottom die of the stack is mounted on a substrate.

FIG. 12 illustrates a newer approach 1200 of stacking die on top of one another. This example shows the stack including a bottom die, a middle die and a top die. This stacking approach, commonly referred to as three dimensional (3D) stacking, is based on vertical connections 1202, referred to as through silicon vias (TSV), that are formed from the bottom surface of a die to the top surface of the die. When die are stacked, contact points (micro bumps) 1204 on the surfaces of each die connect the embedded TSVs of each die together to provide vertical signaling paths up and down the die stack from a substrate. While not shown each die contains functional circuits that are connected to some of the TSVs. There are many advantages of using TSVs, including but not limited too, simplification of connectivity, high bandwidth signaling and the ability to provide an extremely large number of connections between die in a stack.

While the test architecture of this disclosure may be implemented in die that are stacked using the older pyramid approach of FIG. 11 or the newer 3D approach of FIG. 12, this disclosure describes the test architecture as it would be implemented in die that are designed to be stacked using the 3D approach of FIG. 12. However, it should be understood that the test architecture of this disclosure is not limited to only being used in die that are stacked according to the 3D approach. Indeed, the test architecture may be implemented in die designed to be stacked in either the pyramid approach, the 3D approach or in various arrangements that may use a mixture of pyramid and 3D approaches. Further, the test architecture may be implemented in die that are not necessarily intended to be stacked, i.e. a standalone die.

FIG. 13A illustrates a test architecture of the disclosure designed into a die 1300 that is to be used as the bottom die in a 3D stack die arrangement. The test architecture includes the Improved TAP 1002 and parallel test circuits 1004 of FIG. 10, gating circuitry 1306, 3-state buffers 1302, and multiplexer 1304. The die includes an N signal wide bus of PTDI TSVs 1202 extending from contact points 1204 on the bottom surface of the die to contact points 1204 on the top surface of the die. The die includes a bus of Test Control Input (TCI) TSVs 1202, including the CPT, UPD, TCK and TMS signals of FIG. 10, that are coupled between contact points 1204 on the bottom surface of the die to contact points 1204 on the top surface of the die. The die includes a TDI contact point 1204 on the bottom surface of the die for inputting a TDI signal to the Improved TAP. The die includes a TDO contact point on the bottom surface of the die for outputting a TDO signal from multiplexer 1304. The die includes a bus of PTDO TSVs 1202 extending from contact points 1204 on the top surface of the die to contact points 1204 on the bottom top surface of the die. The die includes a TDI contact point 1204 on the top surface of the die for inputting a TDI signal to multiplexer 1304. The die includes a TDO contact point 1204 on the top surface of the die for outputting a TDO signal from the Improved TAP 1002. For the bottom die of FIG. 13, the term "bottom surface" means the die surface to be coupled to a system substrate, and the term "top surface means the die surface to be connected to an upper die in the stack.

Gating circuit 1306 has inputs coupled to some or all of the TCI contact points on the bottom surface of the die, a Link input from the IRO from the Improved TAP and outputs coupled to some or all the TCI contact points on the top surface of the die. Any TCI signals that are not routed through the gating circuit simply bypass the gating circuit as shown in dotted line.

As seen in all gating examples of FIGS. 13B-13E, at least one or both of the TCK and TMS signals may be gated off. When one or both of the TCK and TMS signals are gated off, TAPs in upper die that are connected to the TCI bus are disabled from operating.

The multiplexer 1304 inputs the TDO from the Improved TAP, the TDI input from the top surface contact point, a control signal from the IRO bus of the Improved TAP and outputs a TDO signal to the bottom surface contact point.

Each Parallel Test Circuit 1004 inputs a bus of N or less than N PTDI signals from the N wide PTDI TSV bus 1202 from a tester, the DRC bus from the Improved TAP, optionally the IRO bus from the Improved TAP, and outputs a bus of N or less than N PTDO signals to buffers 1302. The buffers, when enabled by the IRO output of the Improved TAP, output the N or less than N PTDO signals to the N wide PTDO TSV bus 1202 to the tester. The PTDI and PTDO buses may be dedicated for communicating test signals or they may be shared between communicating test signals and function signals. The N width of the PTDI and PTDO buses is established by the Parallel Test Circuit 1004 having the widest parallel test input and parallel test output. For example, if a Parallel Test Circuit 1004 has a 32 bit parallel test input and 32 bit parallel test output, N will be set to 32 bits.

The Improved TAP has CPT, UPD, TMS and TCK inputs coupled to the TCI TSV bus, a TDI input coupled to the bottom surface TDI contact point, a TDO output coupled to the multiplexer, DRC outputs coupled to the Parallel Test Circuits and IRO outputs coupled to buffer 1302 and optionally to some or all of the Parallel Test Circuits.

When access to only the Improved TAP of die 1300 is required, the Link signal to gating circuit 1306 is set to gate off the TCI inputs to the top surface TCI contact points, and the control signal to multiplexer 1304 is set to select the TDO output of the Improved TAP to be output on the bottom surface TDO contact point. In this configuration, a scan path is formed from the bottom surface TDI contact point of die 1300, through the Improved TAP of die 1300 and to the bottom surface TDO contact point of die 1300, via multiplexer 1304.

When access to the Improved TAP of die 1300 and a TAP or an Improved TAP of an upper die is required, the Link signal to gating circuit 1306 is set to gate on the TCI inputs to the top surface TCI contact points, and the control signal to multiplexer 1304 is set to select the top surface TDI contact point to be output on the bottom surface TDO contact point. In this configuration, a scan path is formed from the bottom surface TDI contact point of die 1300, through the Improved TAP to the top surface TDO contact point of die 1300, through the TDI to TDO path of the upper die TAP and back to the top surface TDI contact point of die 1300 and through multiplexer 1304 to the bottom surface TDO contact point of die 1300.

Figure 1:
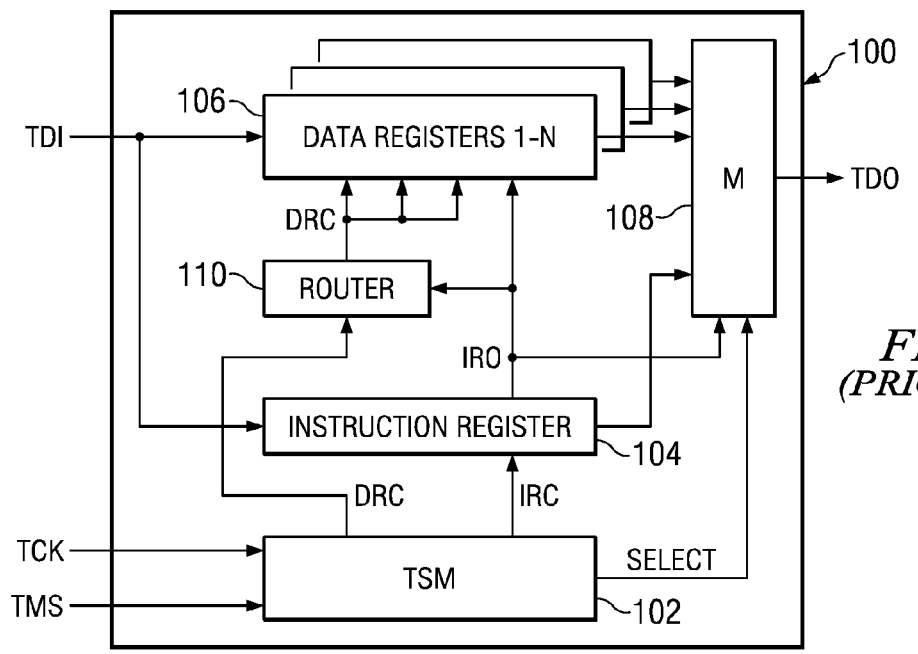
Figure 2:
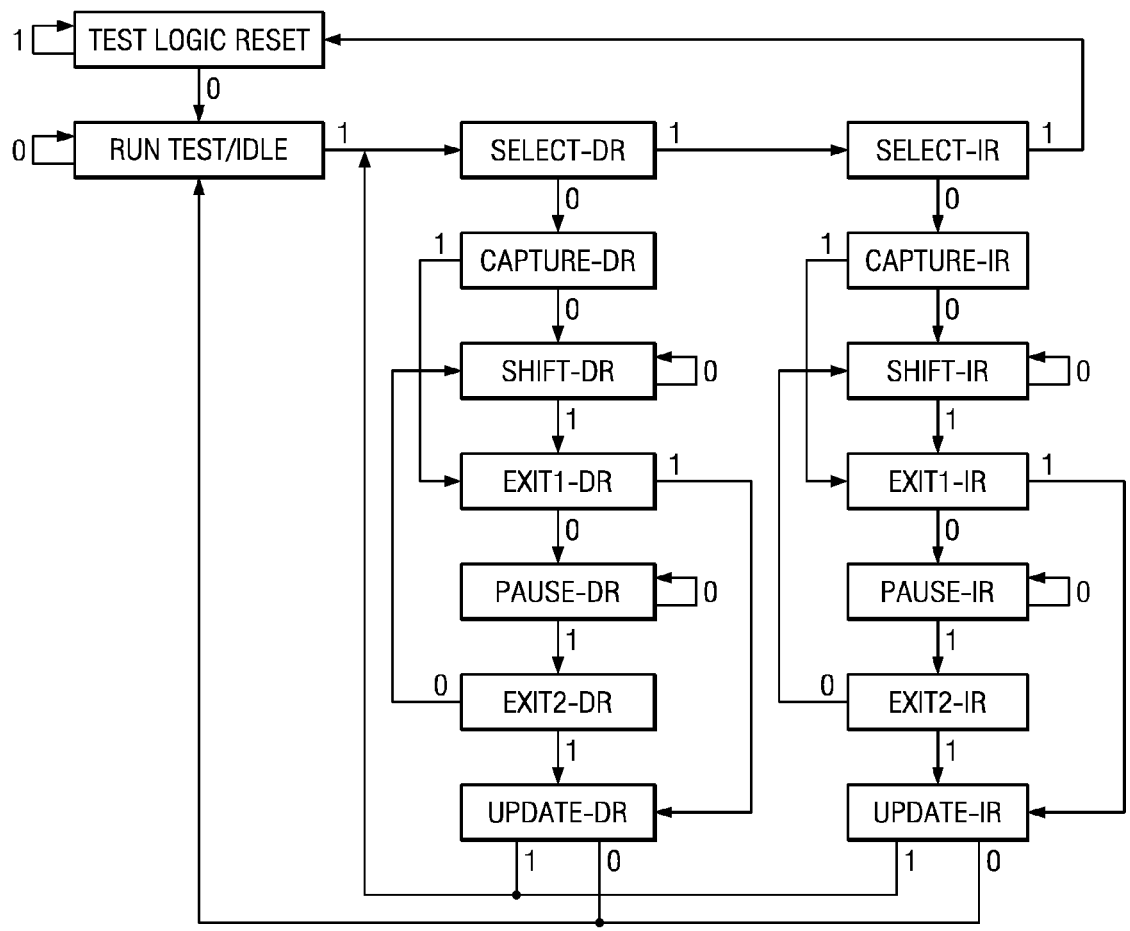
Figure 3:
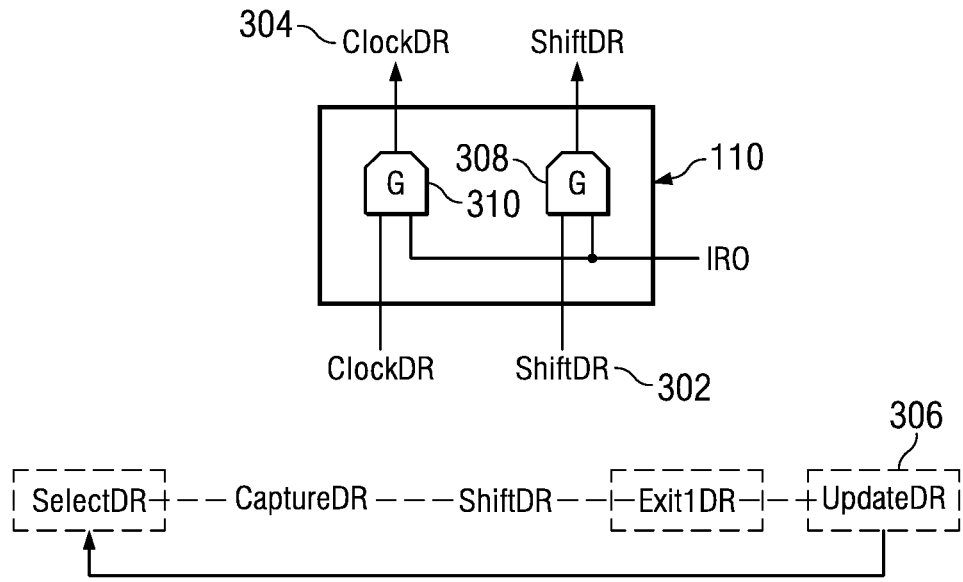
Figure 4:
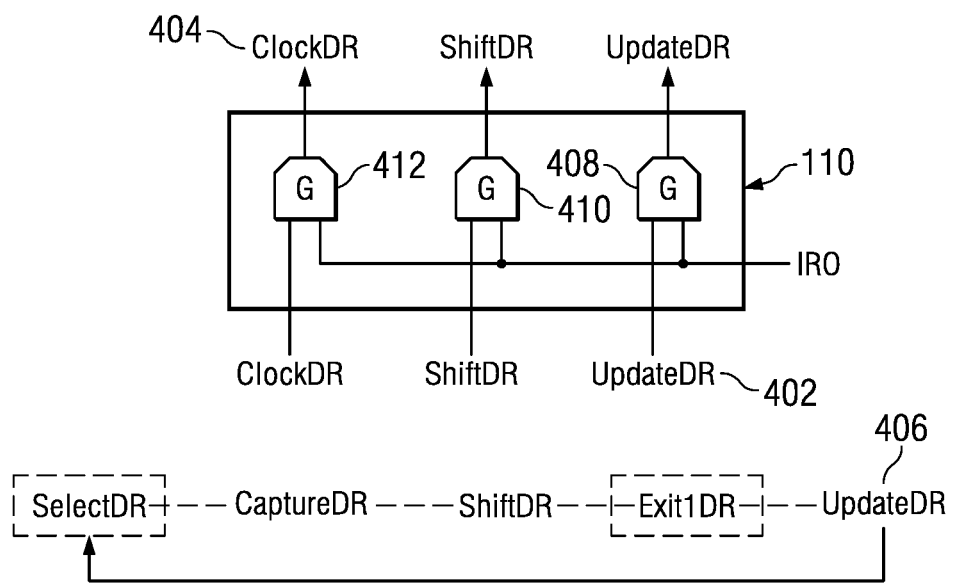
Figure 5:
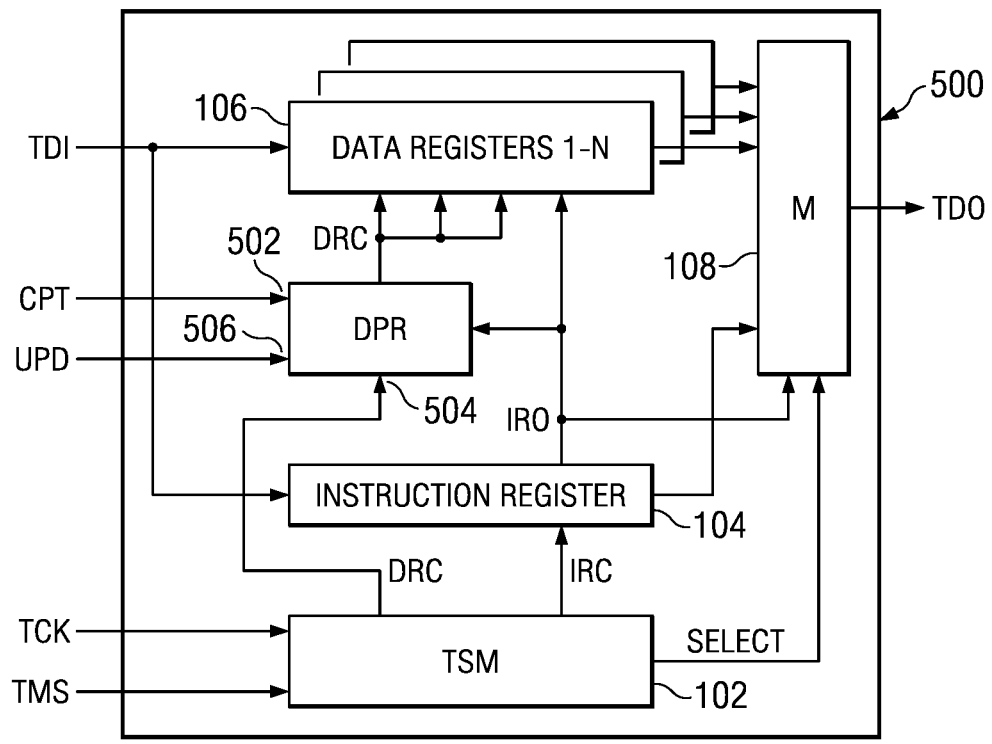
Figure 6:
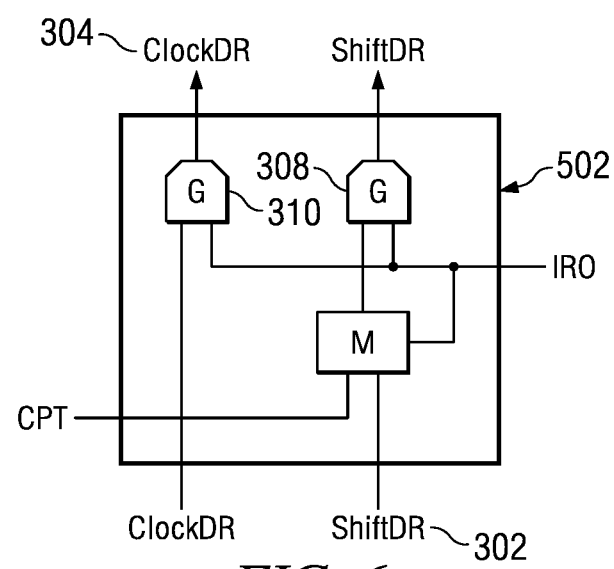
Figure 7:
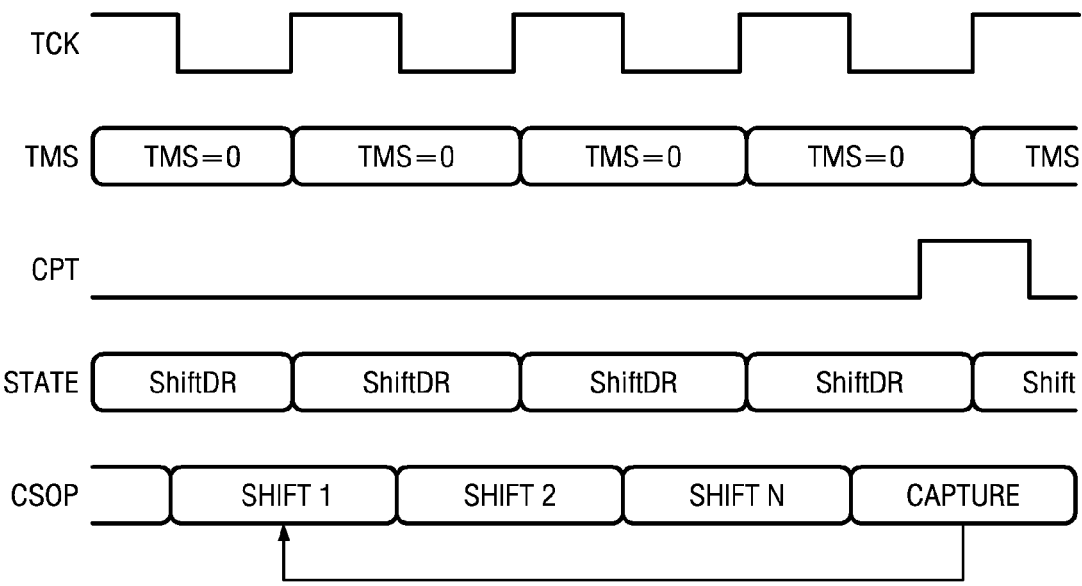
Figure 8:
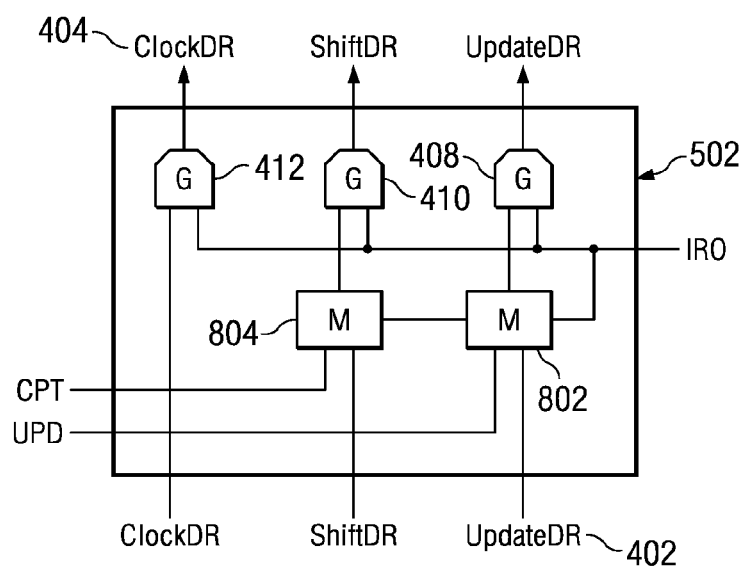
Figure 9:
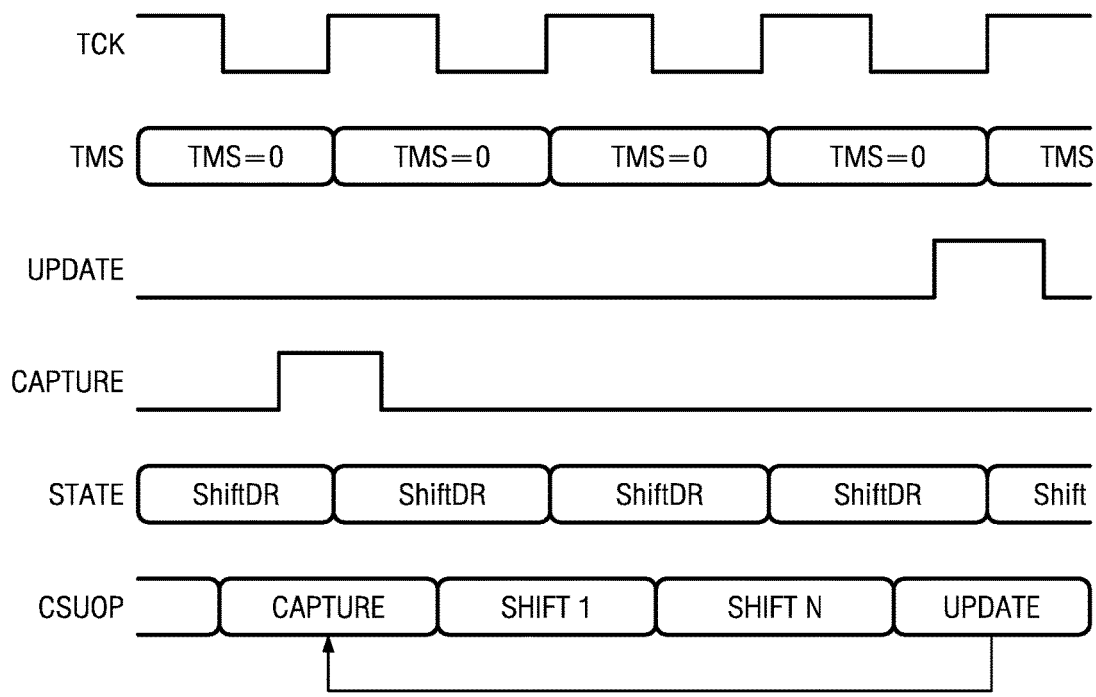
Figure 11:
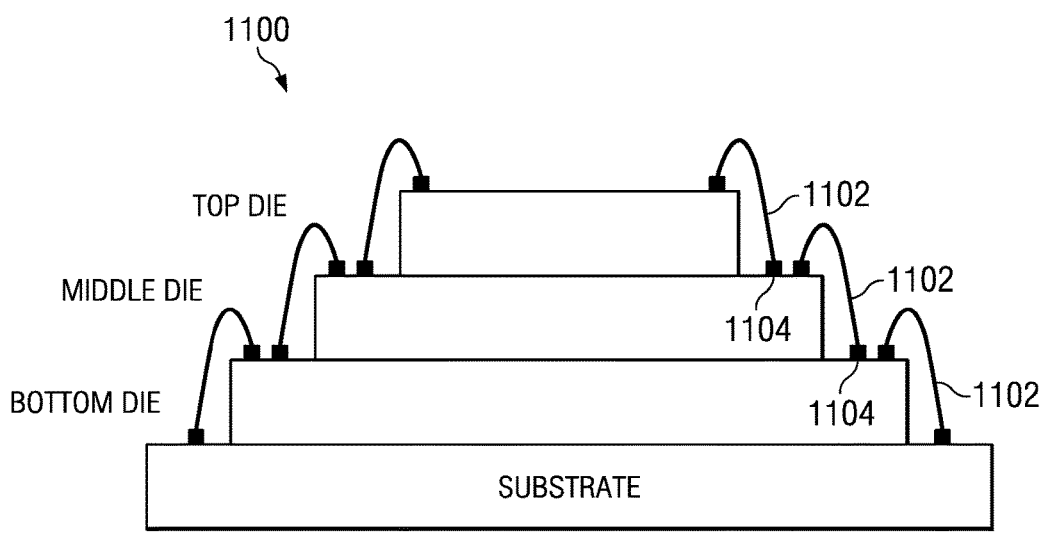
Figure 10:
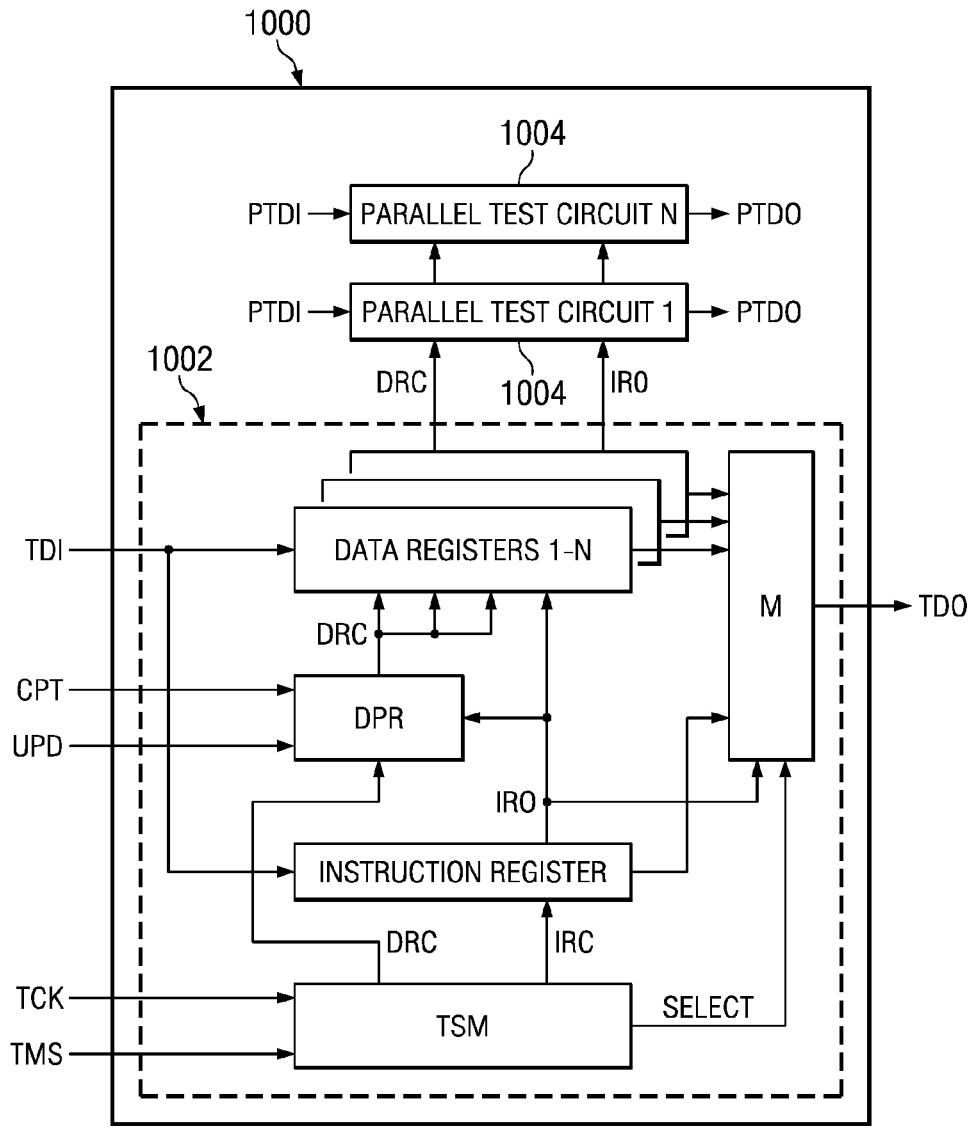
Figure 12:
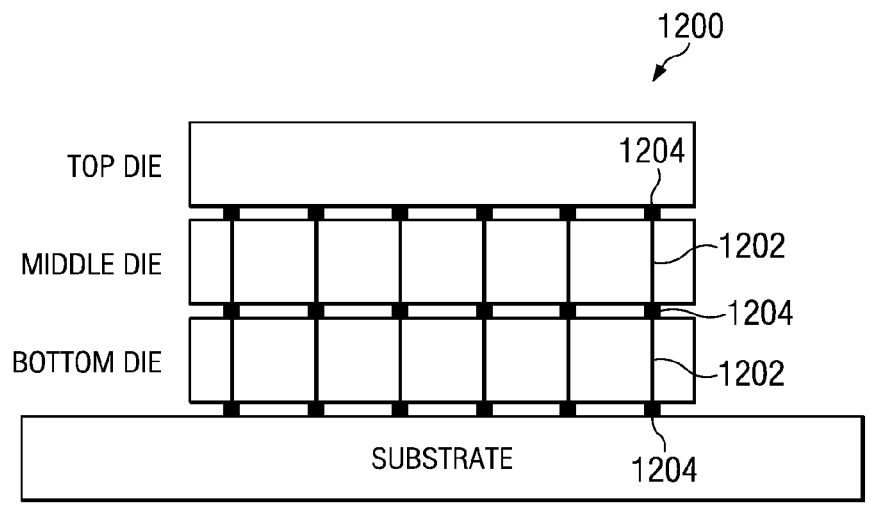

When a Parallel Test Circuit 1004 is to be tested, the Improved TAP will be loaded with an instruction that enables the buffers 1302 associated with the Parallel Test Circuit to be tested to drive the PTDO TSV bus. Other buffers 1302 will not be enabled. Also, and only if required, the instruction will output IRO signals to the Parallel Test Circuit to set up its test operation mode. After this step, the Improved TAP will control the Parallel Test Circuit with the DRC outputs to perform capture and shift type testing or capture, shift and update type testing as described in FIG. 10. When a Parallel Test Circuit is being tested, its PTDO outputs will be the only outputs driving the PTDO TSV bus of a single die or a stack of die.

Figure 14:
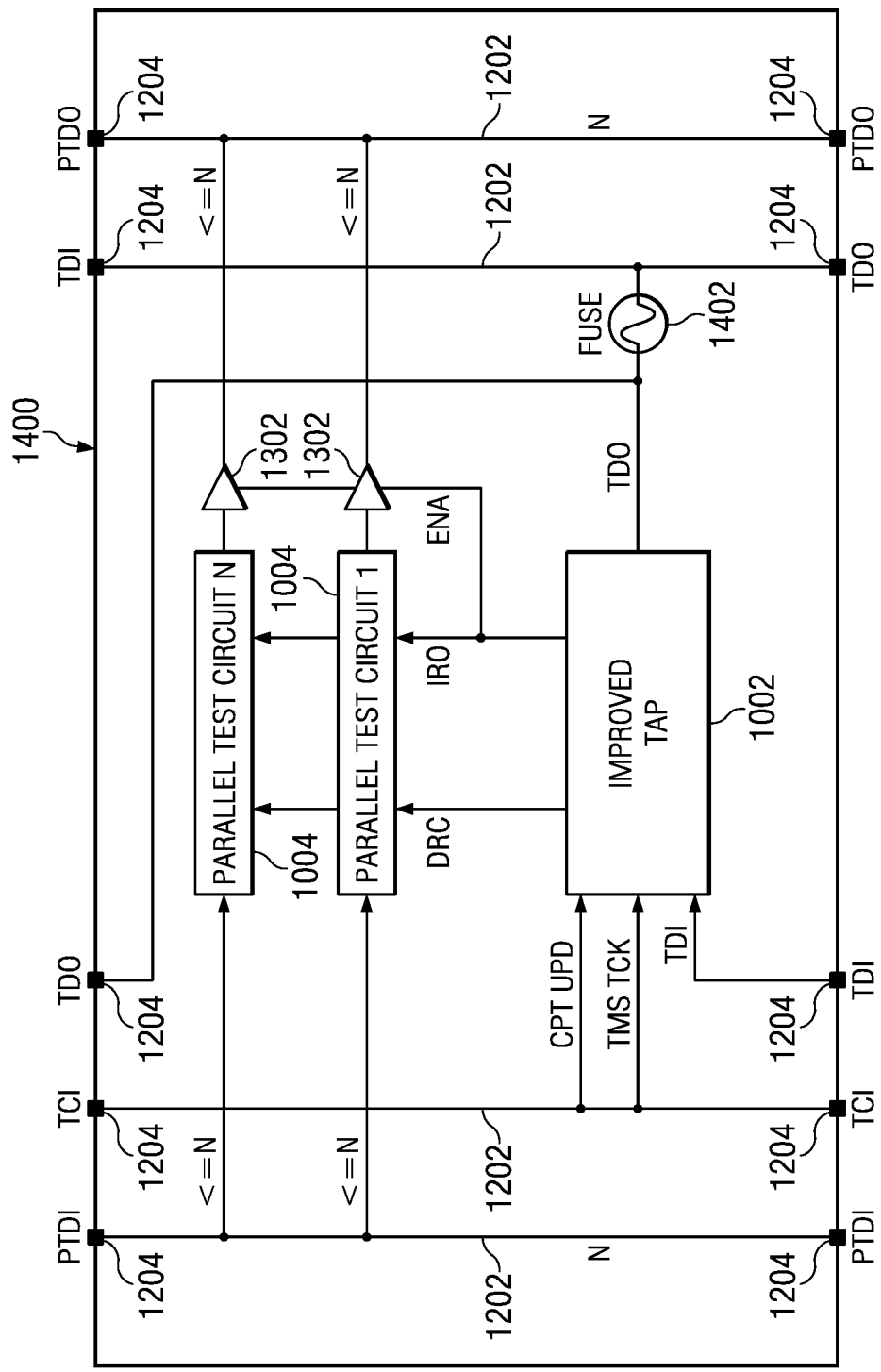

FIG. 14 illustrates a test architecture of the disclosure designed into a die 1400 that is to be used as a middle or a top die in a 3D stack die arrangement. The test architecture includes the Improved TAP 1002, parallel test circuits 1004, 3-state buffers 1302, and a Fuse 1402. The die includes an N signal wide bus of PTDI TSVs 1202 extending from contact points 1204 on the bottom surface of the die to contact points 1204 on the top surface of the die. The die includes a bus of Test Control Input (TCI) TSVs 1202, including the CPT, UPD, TCK and TMS signals of FIG. 10, that are coupled between contact points 1204 on the bottom surface of the die to contact points 1204 on the top surface of the die. The die includes a TDI contact point 1204 on the bottom surface of the die for inputting a TDI signal to the Improved TAP. The die includes a TDO contact point on the bottom surface of the die for outputting a TDO signal. The die includes a bus of PTDO TSVs 1202 extending from contact points 1204 on the top surface of the die to contact points 1204 on the bottom top surface of the die. The die includes a TDI contact point 1204 on the top surface of the die for inputting a TDI signal. The die includes a TDO contact point 1204 on the top surface of the die for outputting a TDO signal from the Improved TAP 1002. The die includes a Fuse 1402 having a first terminal connected to the TDO output of the Improved TAP and the top surface TDO contact point and a second terminal connected to the top surface TDI contact point and the bottom surface TDO contact point.

For the middle or top die of FIG. 14, the term "bottom surface" means the die surface to be coupled to a lower or the bottom die of the stack, and the term "top surface" means the die surface to be connected to an upper middle or the top die in the stack.

Each Parallel Test Circuit 1004 inputs a bus of N or less than N PTDI signals from the N wide PTDI TSV bus 1202, the DRC bus from the Improved TAP, optionally the IRO bus from the Improved TAP, and outputs a bus of N or less than N PTDO signals to buffers 1302. The buffers, when enabled by the IRO output of the Improved TAP, output the N or less than N PTDO signals to the N wide PTDO TSV bus 1202. The PTDI and PTDO buses may be dedicated for communicating test signals or they may be shared between communicating test signals and function signals. The N width of the PTDI and PTDO buses is established by the Parallel Test Circuit 1004 having the widest parallel test input and parallel test output. For example, if a Parallel Test Circuit 1004 has a 32 bit parallel test input and 32 bit parallel test output, N will be set to 32 bits.

The Improved TAP 1002 has CPT, UPD, TMS and TCK inputs coupled to the TCI TSV bus, a TDI input coupled to the bottom surface TDI contact point, a TDO output coupled to the Fuse 1402 and the top surface TDO contact point, DRC outputs coupled to the Parallel Test Circuits and IRO outputs coupled to buffers 1302 and optionally to some or all of the Parallel Test Circuits.

Fuse 1402 is an important aspect of the present disclosure, as is allows the die 1400 to be programmed for use as either a middle die in a stack of die, or as the top die in a stack of die. This allows a die manufacturer to design and manufacture only one version of a die that a customer may purchase and chose to use it as either a middle die in the stack or the top die in the stack. The choosing is simply accomplished by keeping the Fuse 1402 closed as it was manufactured so that the die could be used as a top die in the customer's die stack, or by opening the Fuse so that the die could be used as a middle die in the customer's die stack. The opening of the Fuse could be done in a myriad of ways, grounding the top surface TDO contact point and apply a voltage sufficient to blow the Fuse at the bottom surface TDO contact point. The opening and closing of Fuse 1402 could be reversible if an electrically programmable fuse were used. While the word Fuse is used, it should be understood, element 1402 could be any type of circuit or connection that can pass the TDO signal or not pass the TDO signal. For example, element 1402 could be a 3-state buffer that is selectively enabled to pass the TDO signal or disabled to not pass the TDO signal.

When a Parallel Test Circuit 1004 is to be tested, the Improved TAP will be loaded with an instruction that enables the buffers 1302 associated with the Parallel Test Circuit to be tested to drive the PTDO TSV bus. Other buffers 1302 will not be enabled. Also, and only if required, the instruction will output IRO signals to the Parallel Test Circuit to set up its test operation mode. After this step, the Improved TAP will control the Parallel Test Circuit with the DRC outputs to perform capture and shift type testing or capture, shift and update type testing as described in FIG. 10. When a Parallel Test Circuit is being tested, its PTDO outputs will be the only outputs driving the PTDO TSV bus of a single die or a stack of die.

When the Improved TAP receives TCK and TMS control from the TCI bus it can shift data from the bottom surface TDI contact point to the top surface TDO contact point. If the Fuse 1402 is closed, the data shifted to top surface contact point is also present at the top surface TDI contact point and the bottom surface TDO contact point. If the Fuse 14021 is opened, the data shifted to top surface contact point is not present at the top surface TDI contact point and the bottom surface TDO contact point.

Figure 15:
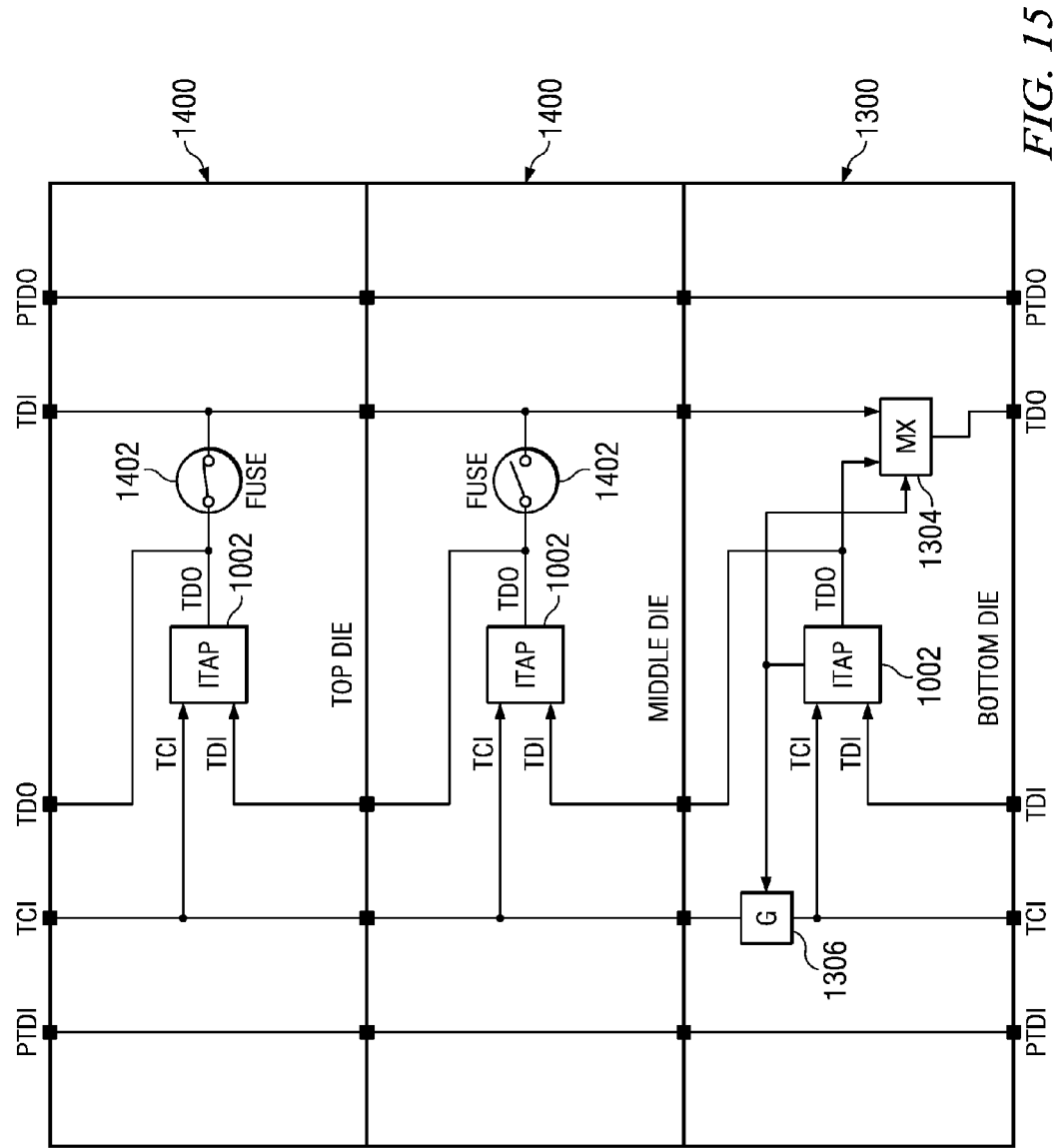

FIG. 15 illustrates a stack die example including a bottom die 1300, a middle die 1400 and a top die 1400. This example illustrates how the TAPs 1002 of the die in the stack are accessed, according to the disclosure. As seen, the Fuse 1402 of the middle die 1400 has been opened to allow the die to operate as a middle die in the stack, and the Fuse 1402 of the top die 1400 remains closed to allow the die to operate as the top die in the stack.

When an instruction is loaded into the bottom die to allow access to the Improved TAP of the bottom die 1300, the Improved TAP will respond to the TCK and TMS control signals of the TCI bus to input data from the bottom surface TDI contact point and output data to the bottom surface TDO contact point via multiplexer 1304. As described in FIG. 14, the instruction controls the gating circuit to gate off the TCI control signals to the TAPs of the upper die, and also controls multiplexer 1304 to couple the TDO output of the Improved TAP of the bottom die to the bottom surface TDO contact point.

When an instruction is loaded into the bottom die to allow daisy-chained access to the Improved TAPs of the bottom, middle and top die, the Improved TAPs will respond to the TCK and TMS control signals of the TCI bus to input data from the TDI contact point on the bottom surface of the bottom die and output data to the TDO contact point on the bottom surface of the bottom die via multiplexer 1304. As described in FIG. 14, the instruction loaded into the bottom die controls the gating circuit to gate on the TCI control signals to the TAPs of the upper die, and also controls multiplexer 1304 to couple the TDO output of the top die to the bottom surface TDO contact point of the bottom die, via the TDO TSV signal path in the die stack. As seen in FIG. 15, the Fuse 1402 of the middle die is opened, allowing the closed Fuse 1402 of the top die to pass the TDO output of the TAP of the top die to the bottom surface TDO output of the bottom die, via multiplexer 1304.

Figure 16:
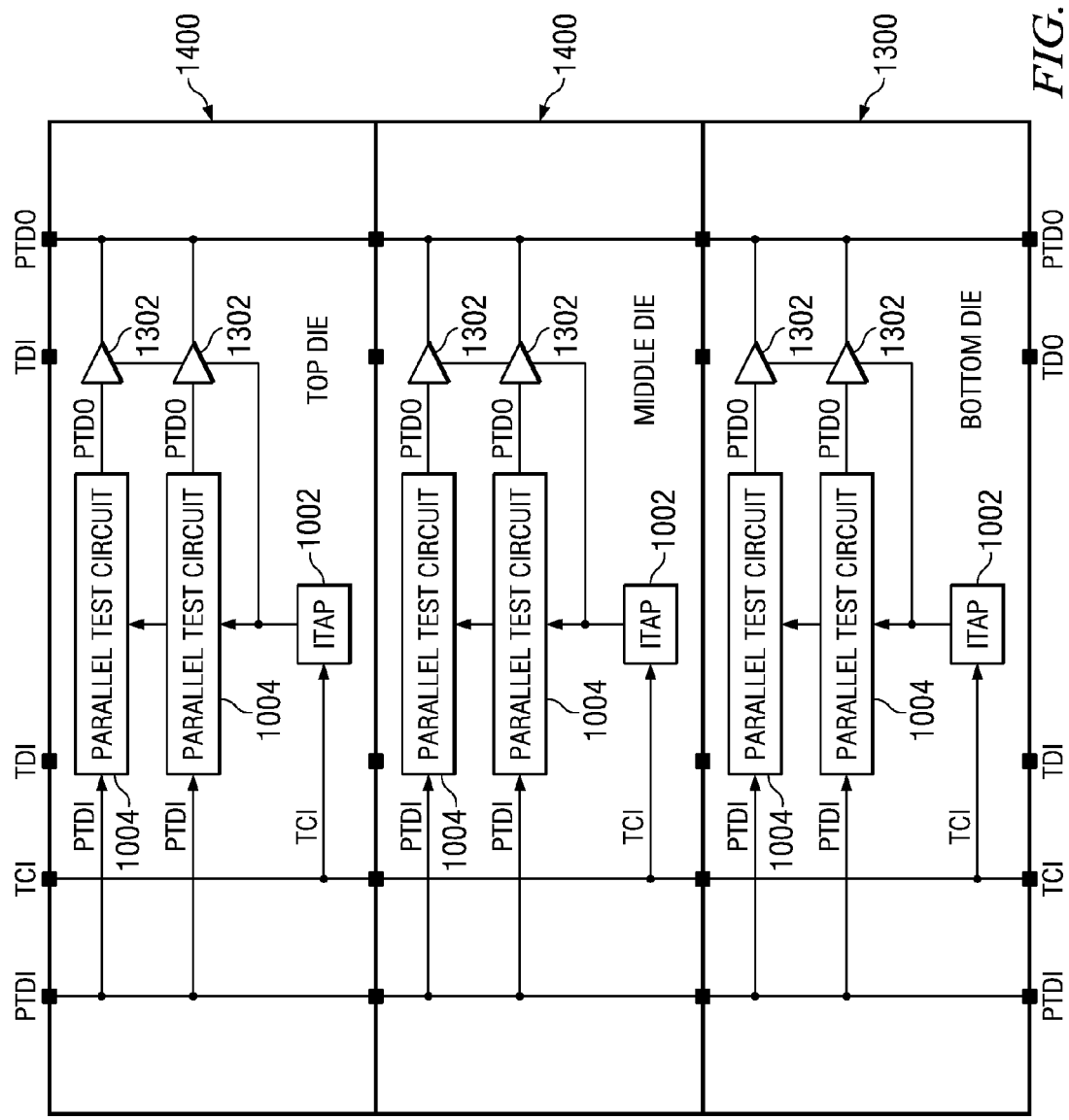

FIG. 16 illustrates a stack die example including a bottom die 1300, a middle die 1400 and a top die 1400. This example illustrates how the parallel test circuits 1004 of each die in the stack are accessed, according to the disclosure. This description assumes the die TAPs are daisy-chained as described in FIG. 15, to allow instructions to be loaded in all the die TAPs.

When an instruction is loaded into a TAP 1002 of one of the die, i.e. the top, middle or bottom die, to enable a parallel test circuit in that die, the buffers 1302 associated with that parallel test circuit are enabled to drive the PTDO TSV bus of the die stack. The parallel test circuit receives DRC control from the TAP to input parallel data from the PTDI TSV bus of the stack and output parallel data to the PTDO TSV bus of the stack. The parallel test circuit may be controlled to perform capture and shift test operations or it may be controlled to perform capture, shift and update test operations, as previously describe in FIGS. 13A and 14. As seen, only the selected parallel test circuit 1004 is enabled to drive the PTDO TSV bus. This test process is repeated for each parallel test circuit 1004 to be tested in each die of the stack.

Figure 17:
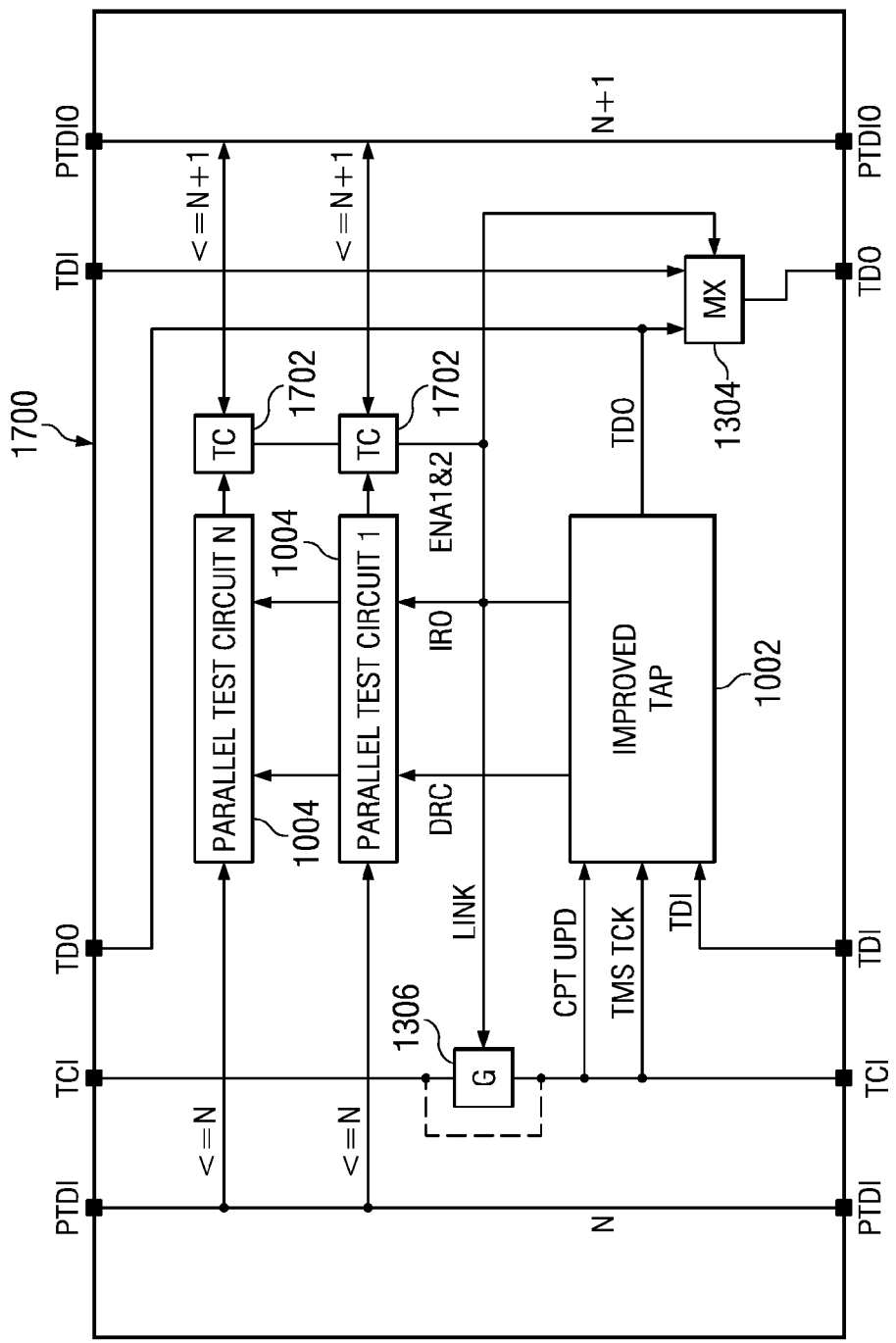

FIG. 17 illustrates an alternate embodiment of the test architecture of the disclosure designed into a die 1700 that is to be used as the bottom die in a 3D stack die arrangement. The test architecture is identical to the test architecture described in FIG. 13A, with the exceptions that (1) the buffers 1302 associated with each parallel test circuit in FIG. 13A have been replaced with a test circuit (TC) 1702 and (2) the N wide PTDO TSV bus of FIG. 13A has been replaced with a N+1 parallel test data input/output (PTDIO) TSV bus.

Figure 18:
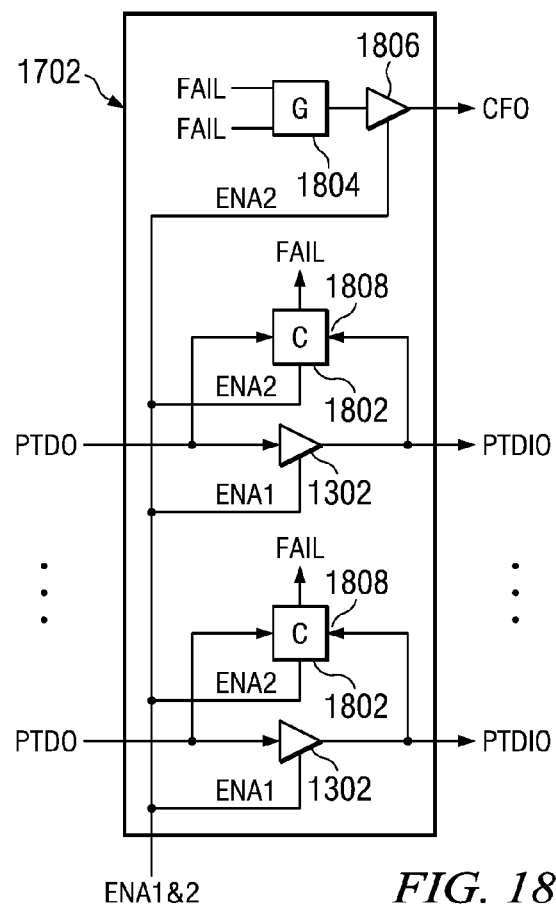

FIG. 18 illustrates an example implementation of TC 1702. The TC includes a plurality of buffer 1302 and comparator 1802 arrangements 1808 connected as shown. Each arrangement has an input coupled to a PTDO of a parallel test circuit 1004 and an input/output coupled to a TSV on the N+1 PTDIO TSV bus. The buffers 1302 have an input coupled to a PTDO of the parallel test circuit, an ENA1 signal from the TAP IRO bus and an output coupled to a PTDIO of the N+1 PTDIO TSV bus. The comparators 1802 have an input coupled to a PTDO of the parallel test circuit, an input coupled to a PTDIO of the N+1 PTDIO TSV bus, an ENA2 signal input from the TAP IRO bus and a Fail output signal. Each Fail output signal is input to an OR gate 1804. The output of the OR gate is input to a 3-state buffer 1806 which, when enabled by ENA2, outputs a Compare Fail Output (CFO) signal to a TSV on the N+1 PTDIO TSV bus. Each TC will receive a unique set of ENA1 and ENA2 control signals from the IRO. The TC 1702 can be enabled to operate in the following two modes.

Figure 13A:
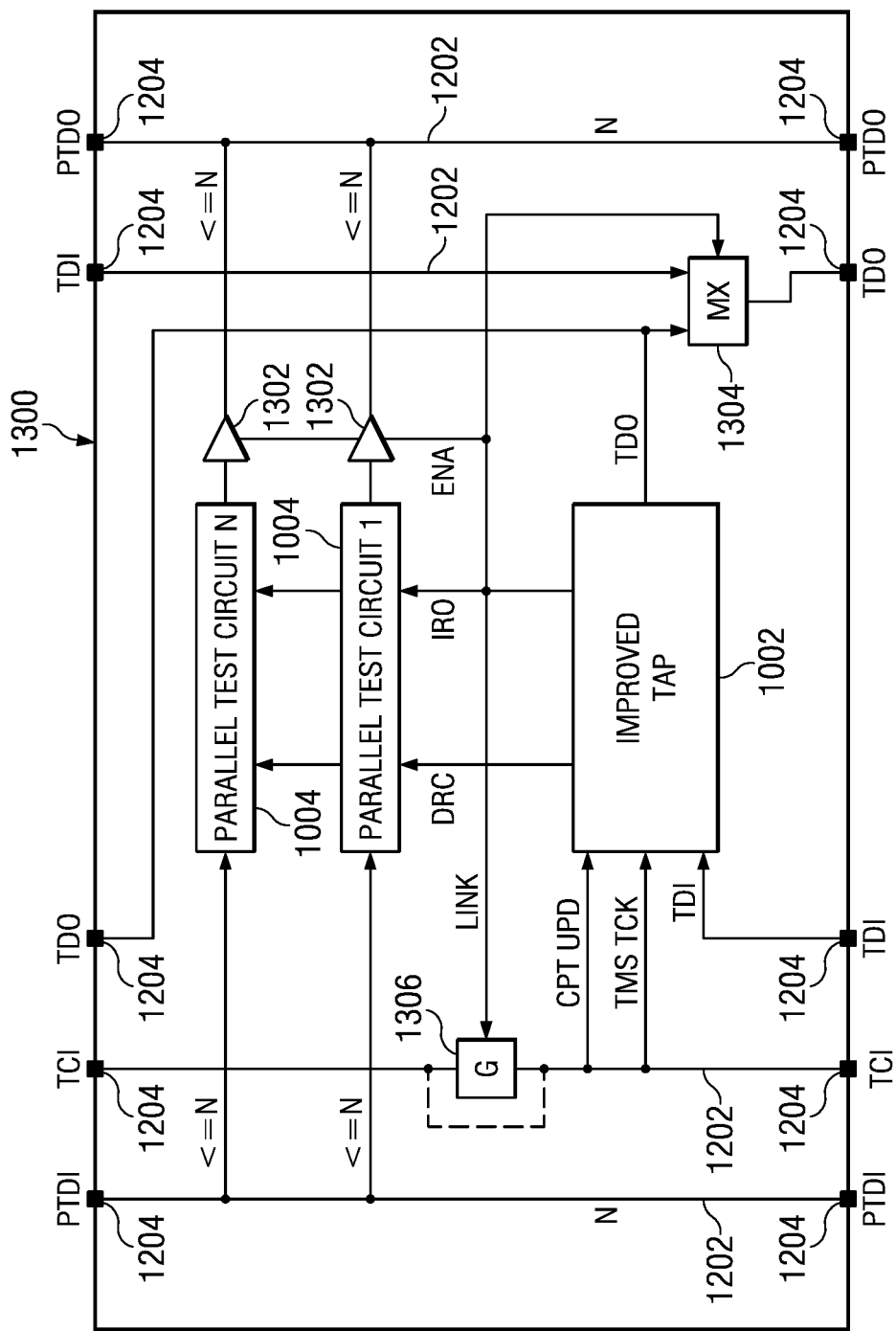
FIG. 13B illustrates a gating circuit 1306 that gates all the TCI CPT, UPD, TCK and TMS signals.
FIG. 13C illustrates a gating circuit 1306 that gates only the TMS and TCK signals.
FIG. 13D illustrates a gating circuit 1306 that gates only the TMS signal.
FIG. 13E illustrates a gating circuit 1306 that gates only the TCK signal.
Figure 13B:
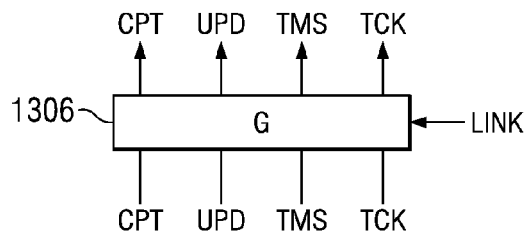
Figure 13C:
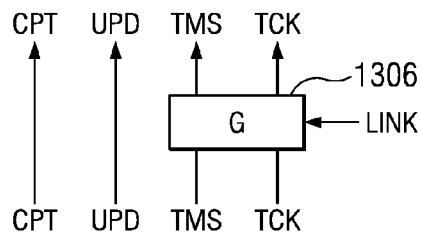
Figure 13D:
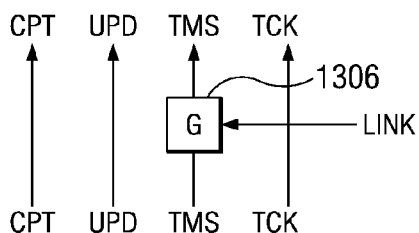
Figure 13E:
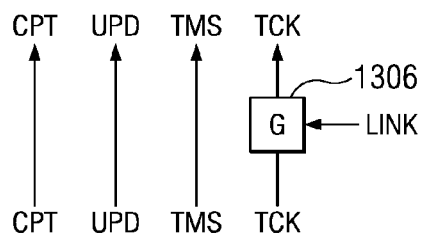

Mode 1—When the ENA1 signal is asserted, the buffers 1302 are enabled to output test data from a parallel test circuit to the PTDIO TSV bus exactly as described in regard to FIG. 13A. A tester coupled to the PTDIO contact points of die 1700 inputs the data for analysis.

Mode 2—When the ENA2 signal is asserted, the comparators 1802 are enabled to compare the data output from a parallel test circuit to data from the PTDIO TSV bus. A tester coupled to the PTDIO contact points of die 1700 inputs the compare data. If a mismatch between the data is detected, the comparators output a Fail signal to gate 1804, which forwards the Fail signal to the CFO signal in the PTDIO TSV bus, which is coupled to the tester via a PTDIO contact point on die 1700.

Testing die 1700 using Mode 1 requires the tester to have a unique PTDIO bus connection to each die 1700 being tested in parallel. For example, if the PTDIO bus is 32 bits wide and 16 die 1700 are being tested in parallel, the tester has to have 512 PTDIO connections to the die.

Testing die 1700 using Mode 2 allows the tester to only have one PTDIO connection to each die 1700 being tested in parallel. Reusing the example above, if the PTDIO bus is 32 bits wide and 16 die 1700 are being tested in parallel, the tester only has to have a 32 bit wide PTDIO connection to the die, plus 16 CRO connections, one from each die.

The advantage of Mode 2 therefore is that it reduces the number of connections between a tester and plural die being tested in parallel. This reduction of connections is beneficial at wafer level testing where lower cost testers and probe mechanisms can be used.

Figure 19:
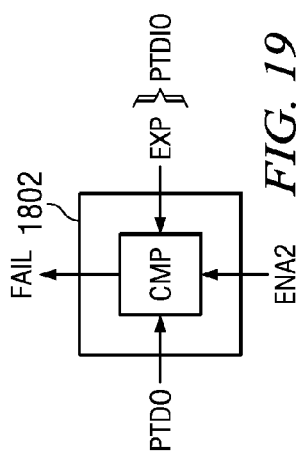

FIG. 19 is provided to illustrate that comparator 1802 may include a compare (CMP) circuit that compares PTDO data from a parallel test circuit against expected data from the PTDIO TSV bus.

Figure 20:
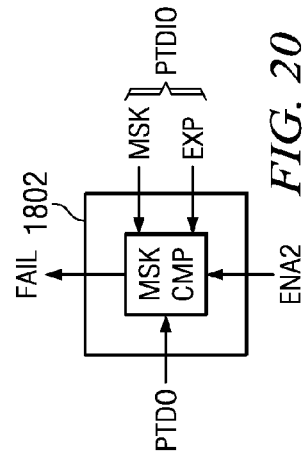

FIG. 20 is provided to illustrate that comparator 1802 may include a maskable compare (MSK CMP) circuit that only compares PTDO data from a parallel test circuit against unmasked expected data from the PTDIO TSV bus. This comparator 1802 circuit is useful when the PTDO data from a parallel test circuit contains don't care or unknown data outputs that can generate false Fail signal outputs.

Figure 21:
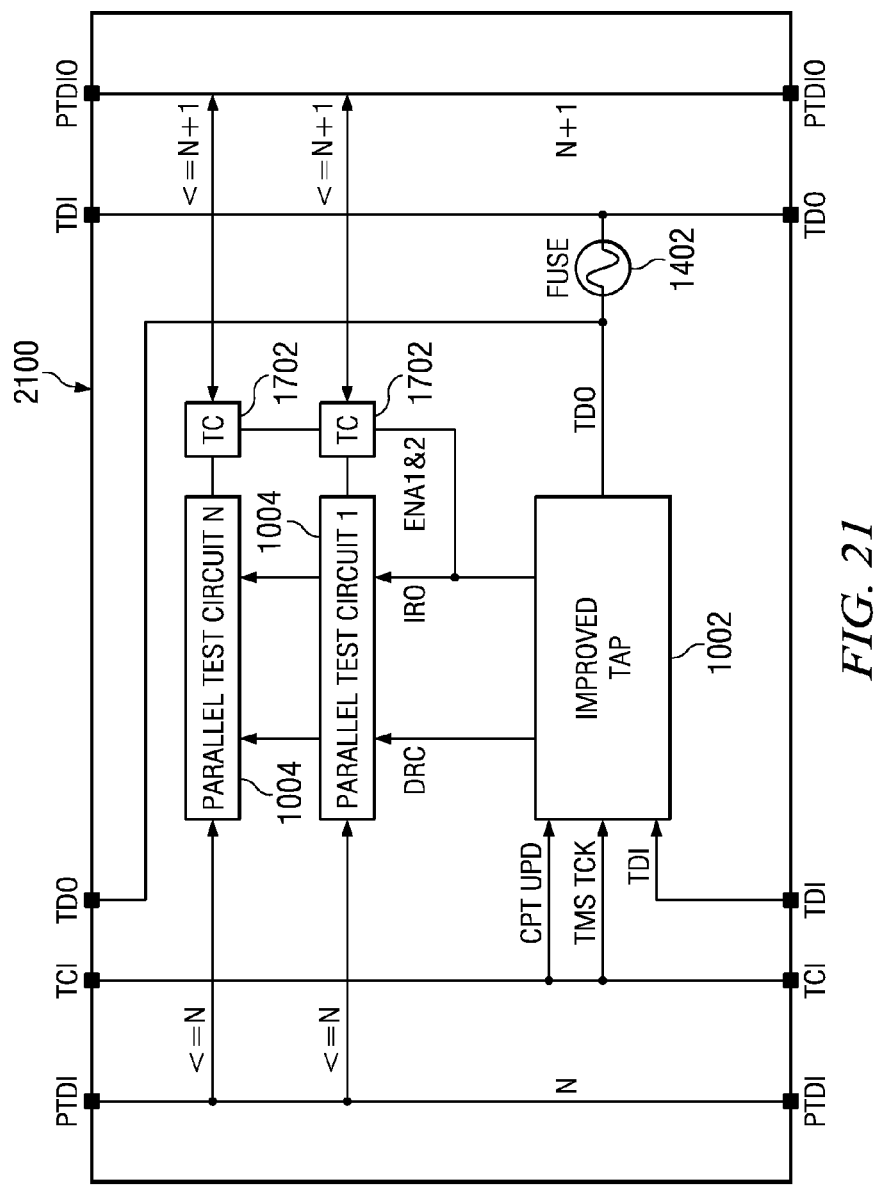

FIG. 21 is provided to illustrate TCs 1702 being used in die 2100 designed for use as a middle die or top die in a die stack.

Figure 22:
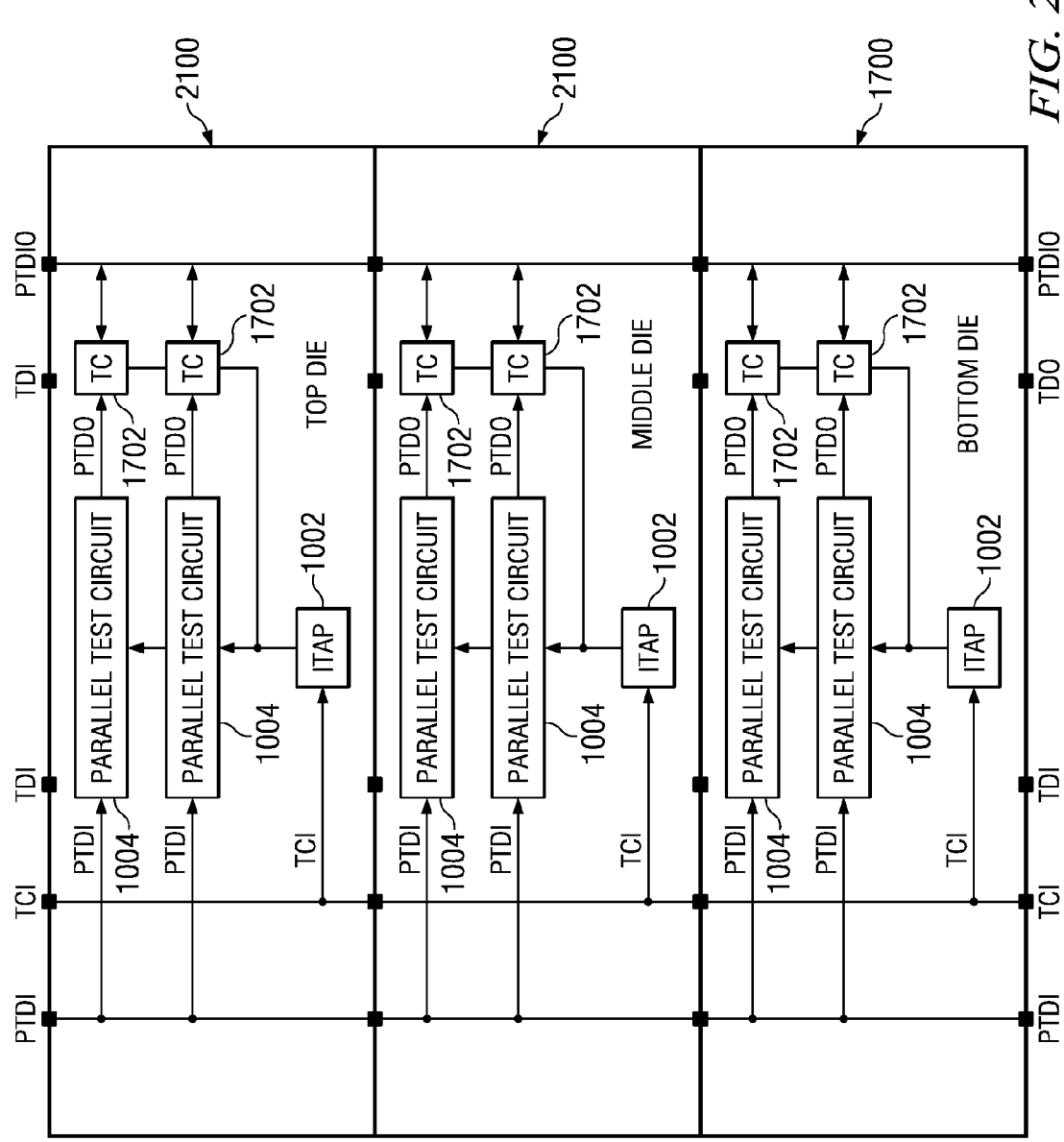

FIG. 22 is provided to illustrate a stack die example including a bottom die 1700, a middle die 2100 and a top die 2100, each die including TCs 1702.

Figure 23:
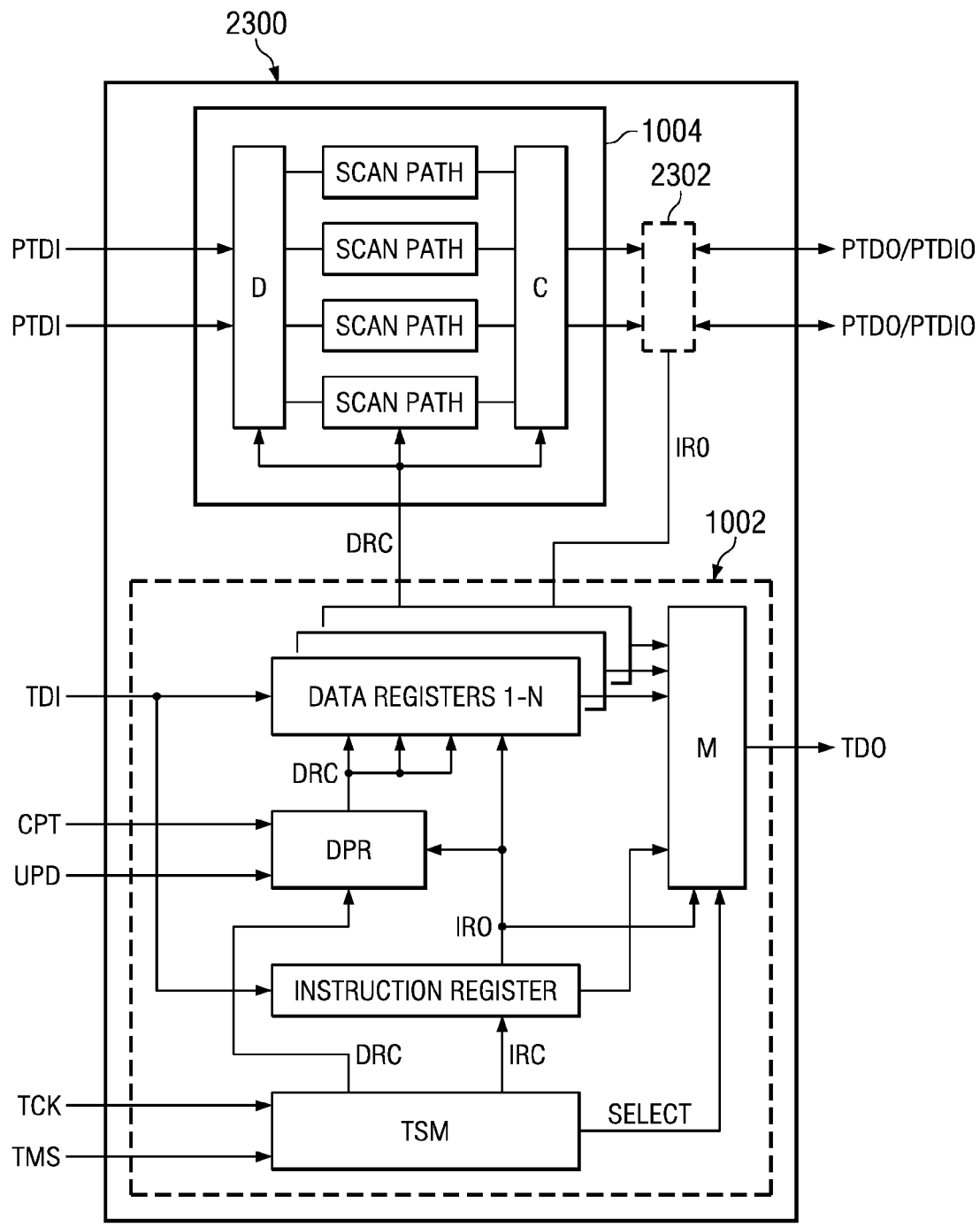

FIG. 23 illustrates a die 2300 including the test architecture of the disclosure wherein the parallel test circuit 1004 is realized as a scan compression circuit having a decompressor (D), parallel scan paths and a compaction circuit (C) controlled by the DRC bus from TAP 1002. Dotted line circuit box 2302 could be either buffers 1302 or TCs 1702.

Figure 24:
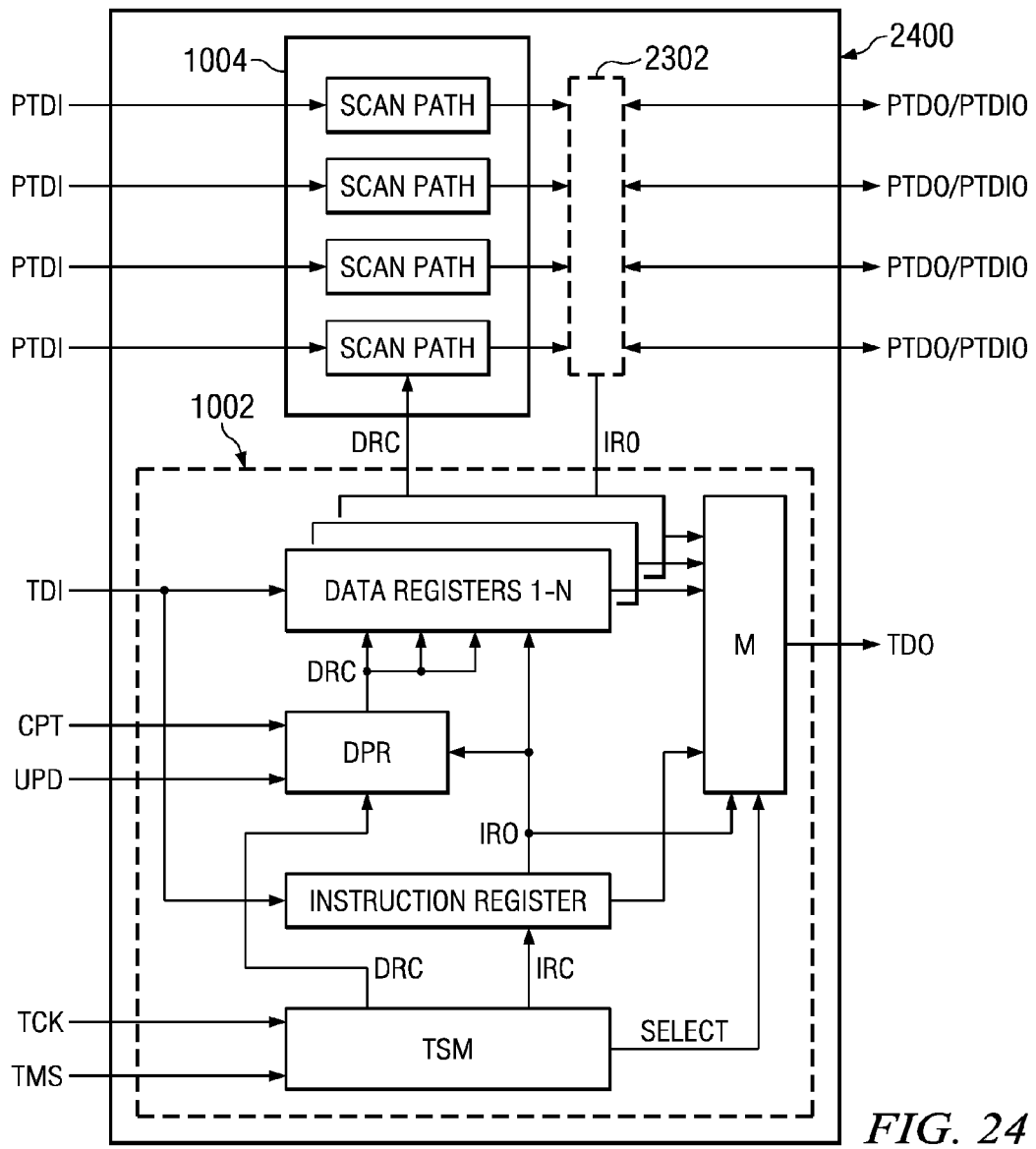

FIG. 24 illustrates a die 2400 including the test architecture of the disclosure wherein the parallel test circuit 1004 is realized as parallel scan paths controlled by the DRC bus from TAP 1002. Dotted line circuit box 2302 could be either buffers 1302 or TCs 1702.

Figure 25:
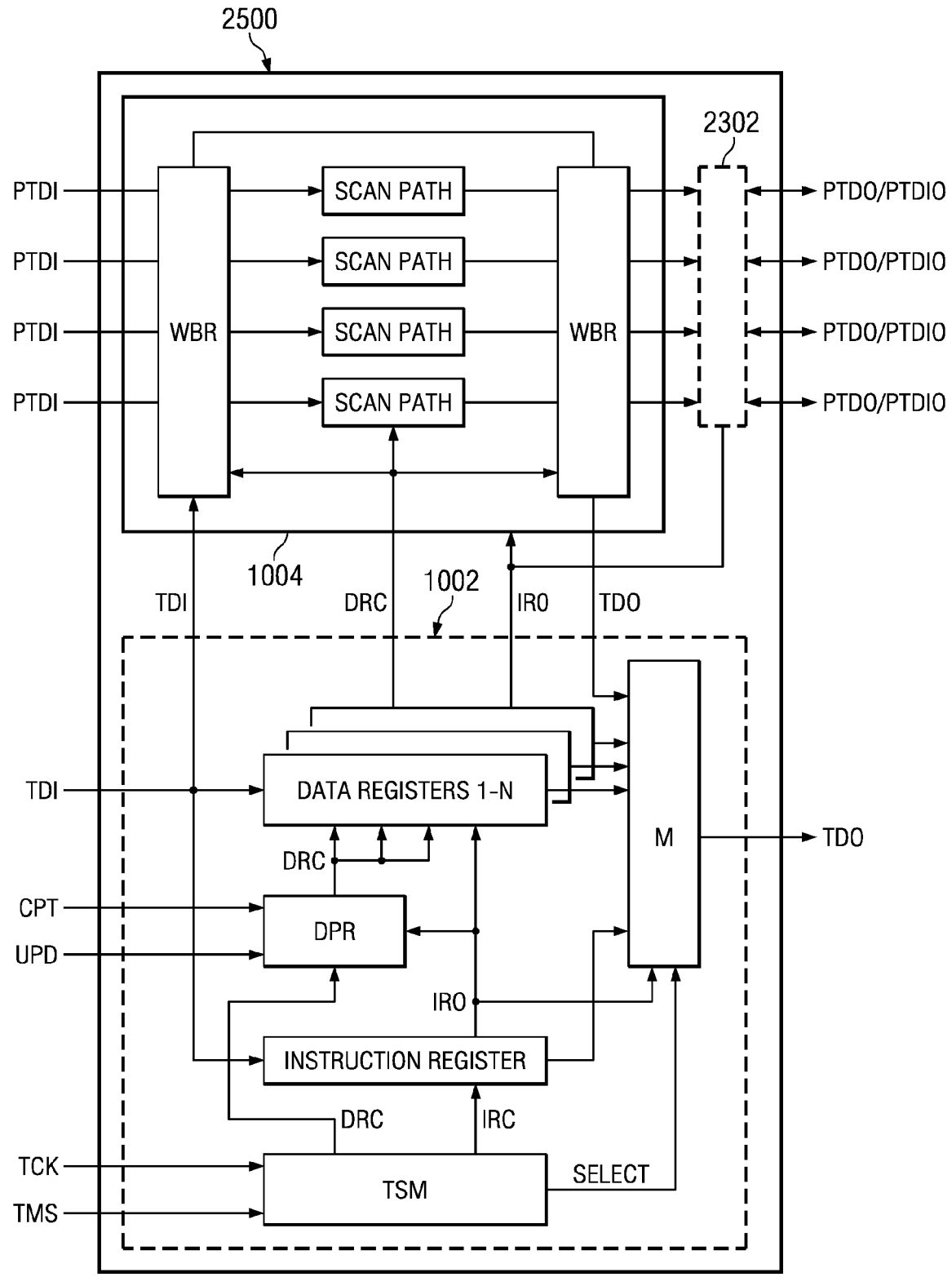

FIG. 25 illustrates a die 2500 including the test architecture of the disclosure wherein the parallel test circuit 1004 is realized as an IEEE 1500 core wrapper having a wrapper boundary register (WBR) and parallel scan paths controlled by the DRC bus of TAP 1002. In this example the WBR is connected as one of the TAP data register to allow it to be accessed from TDI to TDO. Dotted line circuit box 2302 could be either buffers 1302 or TCs 1702.

Figure 26:
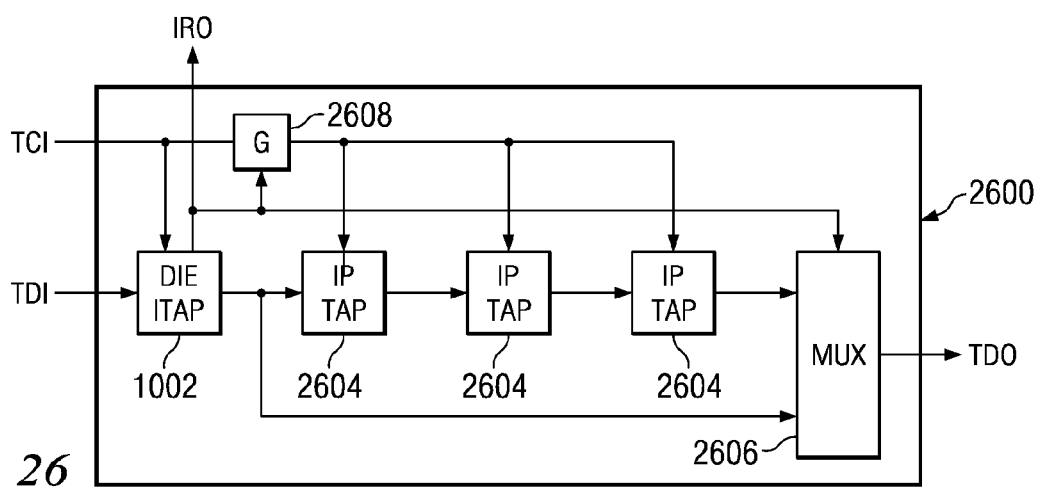
Figure 27:
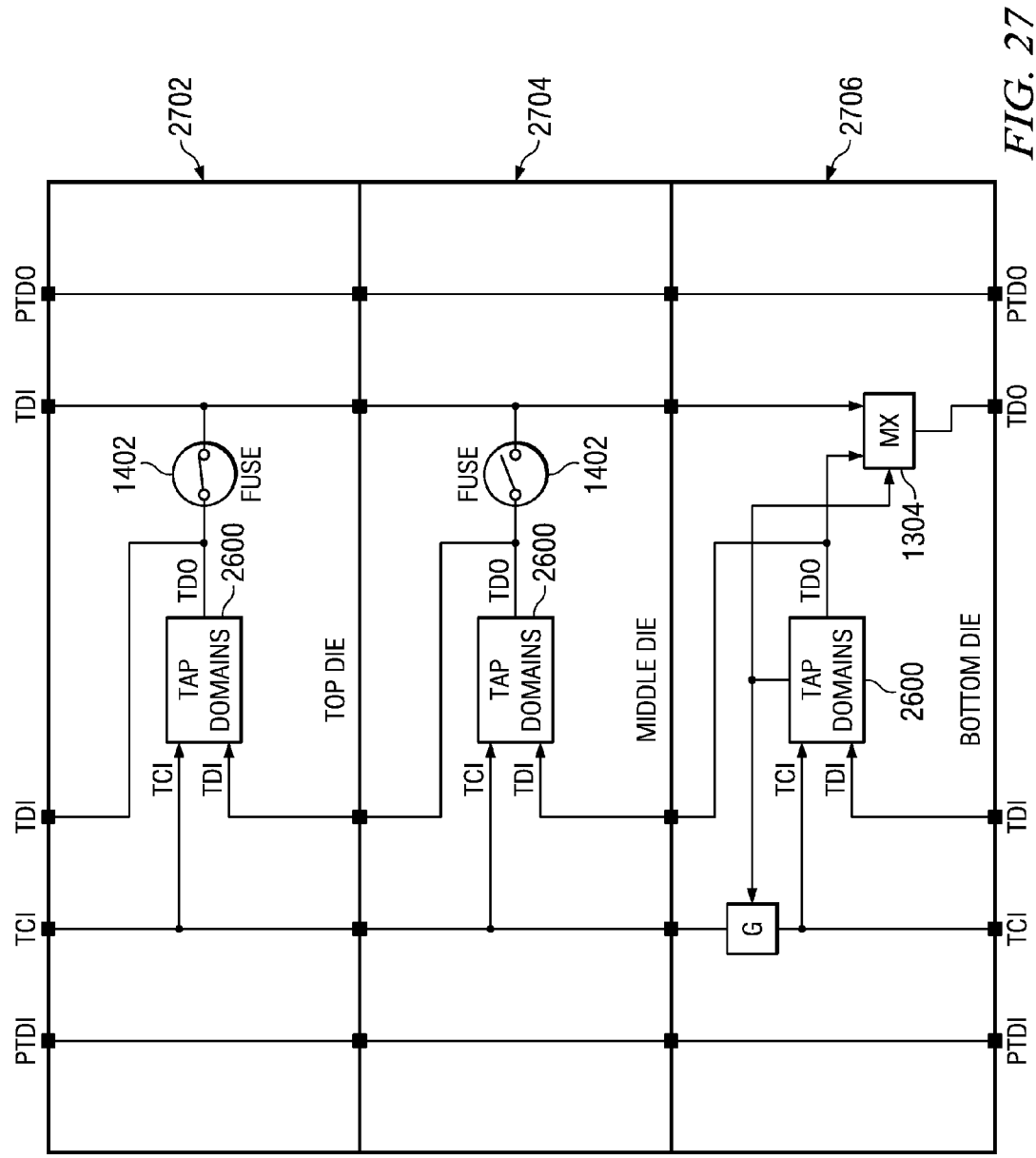

Today it is very common for a die to include one or more additional TAPs, instead of just the single die TAP 1002 shown in the previous Figures. For example, there may be a TAP on each embedded intellectual property (IP) circuit or core in the die. FIGS. 26 and 27 below illustrate how the disclosure can be expanded to accommodate multiple TAP in a die.

FIG. 26 illustrates an example TAP Domain architecture 2600 that supports access to the die ITAP 1002 alone or access to the die ITAP 1002 and multiple embedded IP TAPs 2604. The IP TAPs may be conventional TAPs 100 or they may be Improved TAPs 1002. As seen the architecture includes the die ITAP 1002, one or more IP TAPs 2604, a TDO multiplexer 2606 and gating circuitry 2608 all connected as shown. The die ITAP 1002 outputs the IRO bus from the TAP Domain 2600 and control signals to multiplexer 2606 and gating circuit 2608. Gating circuit 2608 may be any of the previously described gating circuits of FIG. 13B-13E. At power up of following a test reset, the IRO bus disables the gating circuit from passing TCI signals to the IP TAPs and controls the multiplexer to select the TDO output of the die ITAP to be output on TDO of the TAP Domain. In this configuration and during instruction and data scan operations, the die ITAP operates alone to shift data from the TDI input of the TAP Domain to the TDO output of the TAP Domain via multiplexer 2606. Since the TCI inputs to the IP TAPs are gated off they do not respond to the instruction and data scan operations.

When it is required to access the IP TAPs 2604, an instruction is scanned into the die ITAP to output control on the IRO bus to enable the gating circuit 2608 and control the multiplexer to input the TDO from the one or more IP TAPs. After this instruction is loaded, the die ITAP and the one or more IP TAPs all shift data from the TDI input of the TAP Domain to the TDO output of the TAP Domain during instruction and scan operations. After access to the IP TAPs is complete, another instruction is scanned into the die ITAP to disable the gating circuit and control the multiplexer to select the TDO output of the Die ITAP to be output on the TDO output of the TAP Domain.

FIG. 27 illustrates a stack die example including a bottom die 2706, a middle die 2704 and a top die 2702. This example illustrates how the TAP Domains 2600 of the die in the stack are accessed, according to the disclosure. The access is the same as the access described in FIG. 15 with the exception that multiple TAPs existing in the TAP Domain 2600 of each die may be accessed instead of just the single die ITAP 1002.

It is important to note that the bottom and top surface test contact points of one die in this disclosure are shown to line up with bottom and top surface test contact points of another other die in this disclosure. This is intentional and facilitates the die stacking process. If they did not line up, an interposer (redistribution layer) would have to be used between each die in the stack to form the connections between the test contact points.

Although the disclosure has been described in detail, it should be understood that various changes, substitutions and alterations may be made without departing from the spirit and scope of the disclosure as defined by the appended claims.

What is claimed is:

1. An integrated circuit comprising:
  (a) a test data in lead, a test clock lead, a test mode select lead, a test data out lead, and an update lead;
  (b) a TAP state machine having a clock input coupled to the test clock lead, a mode input coupled to the test mode select lead, data register control outputs that include a ClockDR signal and an UpdateDR signal, and instruction register control outputs;
  (c) an instruction register having a test data input coupled to the test data in lead, instruction register control inputs coupled to the instruction register control outputs, and instruction register outputs;
  (d) data registers having test data inputs coupled to the test data in lead, data register control inputs, and instruction register control inputs coupled to the instruction register outputs; and
  (e) dual port router circuitry having:
    (i) first multiplexer circuitry having an input connected to the update lead, an input connected to the UpdateDR signal, a control input connected to one of the instruction register outputs, and an output;
    (ii) first gating circuitry having an input connected to the output of the multiplexer circuitry, an input connected to the control input of the first multiplexer circuitry, and a gated UpdateDR signal output coupled to a data register control input of the data registers.

2. The integrated circuit of claim 1 in which each of the instruction register and the data registers have a test data output, and including a second multiplexer having an input for each test data output, and an output coupled to the test data out lead.

3. The integrated circuit of claim 1 in which each of the instruction register and the data registers have a test data output, and the state machine has a select output, and including a second multiplexer having a select input coupled to the select output, instruction register inputs coupled to the instruction register outputs, an input for each test data output, and an output coupled to the test data out lead.

4. The integrated circuit of claim 1 in which the dual port router circuitry includes second gating circuitry having an input connected to the ClockDR signal, an input connected to the control input of the first multiplexer circuitry, and a gated ClockDR signal output coupled to a data register control input of the data registers.

* * * * *